United States Patent
Harvey

(10) Patent No.: US 7,098,703 B2
(45) Date of Patent: Aug. 29, 2006

(54) RESONANT LOGIC DRIVER CIRCUIT

(75) Inventor: Geoffrey Philip Harvey, Cambridge (GB)

(73) Assignee: Midas Green Limited, Cambridge (GB)

( * ) Notice: Subject to any disclaimer, the term of this patent is extended or adjusted under 35 U.S.C. 154(b) by 0 days.

(21) Appl. No.: 10/474,629

(22) PCT Filed: Apr. 24, 2002

(86) PCT No.: PCT/GB02/01832

§ 371 (c)(1),
(2), (4) Date: Mar. 24, 2004

(87) PCT Pub. No.: WO02/087084

PCT Pub. Date: Oct. 31, 2002

(65) Prior Publication Data

US 2004/0145411 A1 Jul. 29, 2004

(30) Foreign Application Priority Data

Apr. 24, 2001 (GB) .................. 0109971.2

(51) Int. Cl.
*H03B 1/00* (2006.01)
*H03K 3/00* (2006.01)

(52) U.S. Cl. .................. 327/111; 327/110; 326/82; 326/83

(58) Field of Classification Search .................. 327/108, 327/110, 111, 168, 382, 389; 326/82, 83, 326/86, 88

See application file for complete search history.

(56) References Cited

U.S. PATENT DOCUMENTS

| | | | | |
|---|---|---|---|---|
| 3,763,478 A | * | 10/1973 | Yoshizawa et al. | 365/6 |
| 4,922,210 A | * | 5/1990 | Flachenecker et al. | 331/167 |
| 5,264,736 A | * | 11/1993 | Jacobson | 327/365 |
| 5,406,150 A | * | 4/1995 | Austin | 327/110 |
| 5,675,275 A | * | 10/1997 | Heide et al. | 327/181 |
| 5,734,285 A | | 3/1998 | Harvey | 327/291 |
| 5,994,929 A | * | 11/1999 | Sano et al. | 327/111 |
| 6,046,614 A | * | 4/2000 | Takahashi | 327/111 |
| 6,140,848 A | | 10/2000 | Harvey | 327/112 |
| 6,172,550 B1 | * | 1/2001 | Gold et al. | 327/366 |
| 6,836,161 B1 | * | 12/2004 | Akiyama et al. | 327/108 |
| 2004/0166803 A1 | * | 8/2004 | Moloudi et al. | 455/20 |
| 2004/0227547 A1 | * | 11/2004 | Shiraishi et al. | 327/100 |

FOREIGN PATENT DOCUMENTS

| | | |
|---|---|---|
| GB | 2137736 | 10/1984 |
| JP | 5-206817 | * 8/1993 |
| JP | 2000023455 | 1/2000 |

OTHER PUBLICATIONS

Alzarez et al. Fundamental Circuit Analysis, 1978, pp. 319-346.*

* cited by examiner

*Primary Examiner*—Tuan T. Lam
(74) *Attorney, Agent, or Firm*—Townsend and Townsend and Crew LLP

(57) ABSTRACT

An electronic logic driver circuit, for driving a capacitive load between supply potentials for example for use in driving logic circuit elements on or off a chip, is disclosed. The driver circuit comprises switching devices to switch current either to or from two main voltage supply sources and two coupled inductors that act to store energy derived from the voltage sources. In operation, the coupled inductors form an LC resonator with the load such that energy stored in the inductors can be transferred to or from the load to drive a change in the voltage of the load.

30 Claims, 15 Drawing Sheets

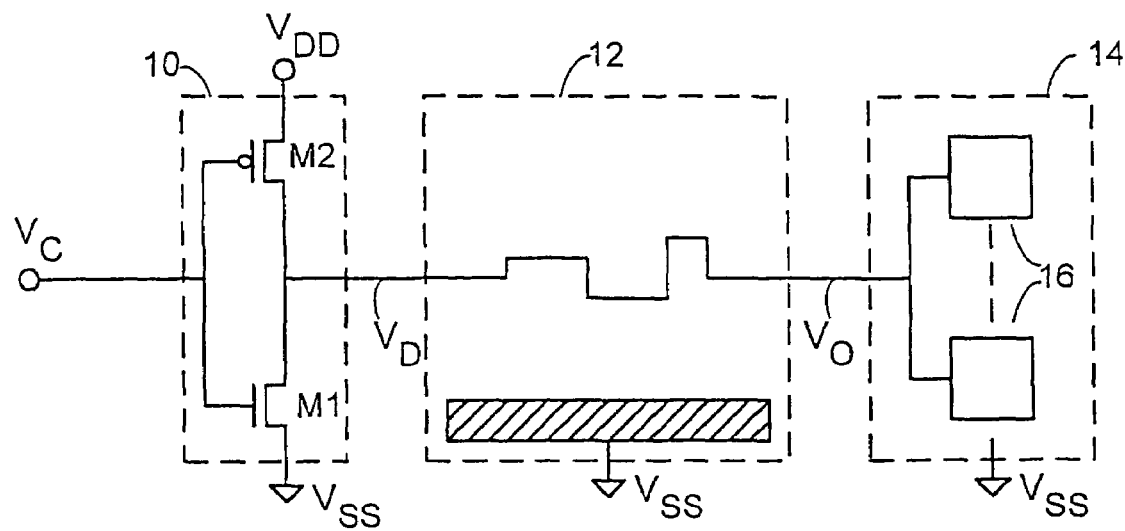
Fig. 1 - Prior Art
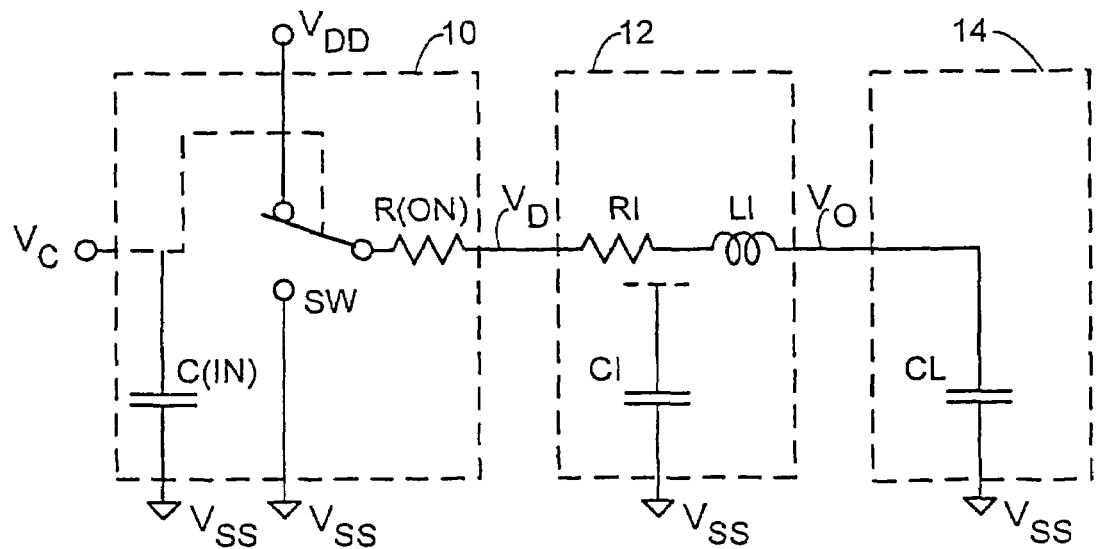
Fig. 2 - Prior Art

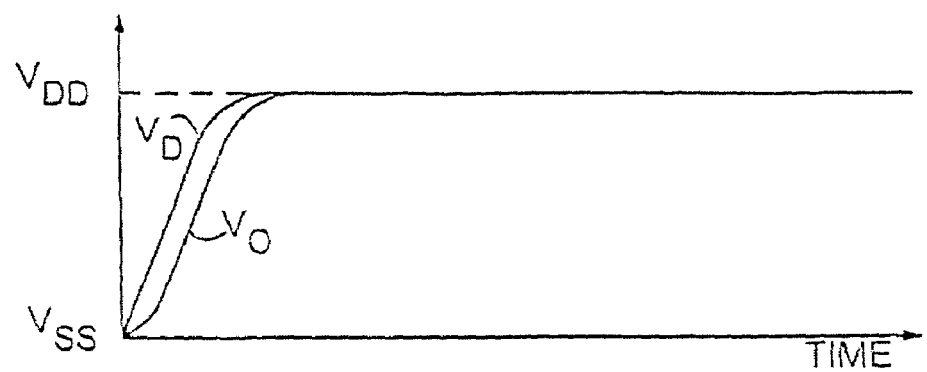
Fig. 3a
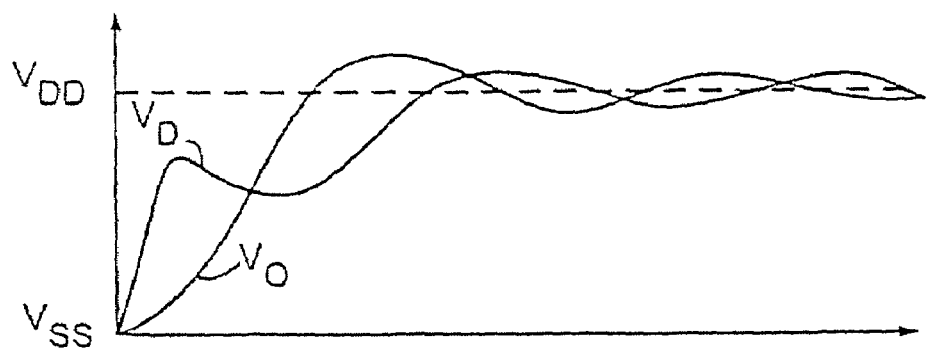
Fig. 3b
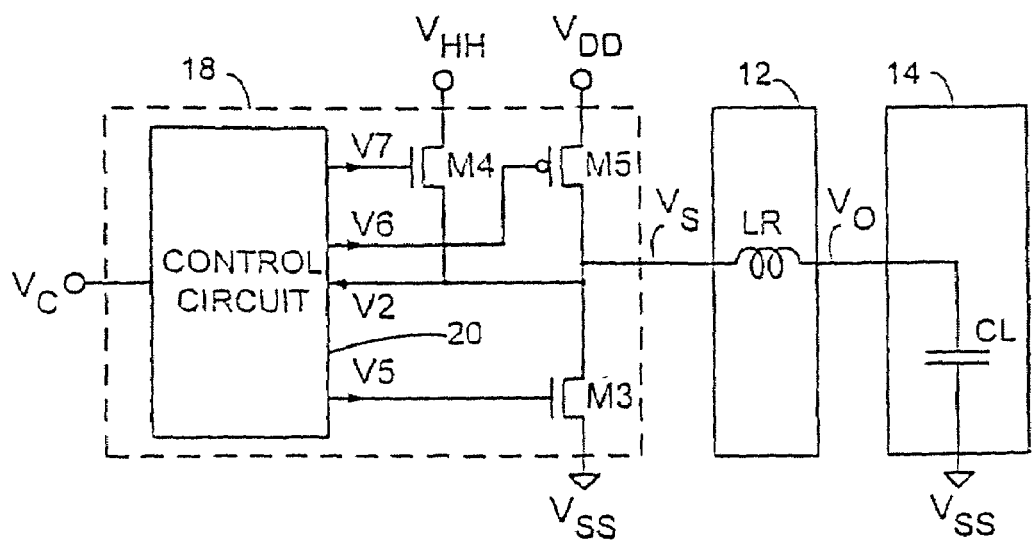
Fig. 4 - Prior Art

RESONANT LOGIC DRIVER CIRCUIT

BACKGROUND TO THE INVENTION

1. Field of the Invention

This invention relates to an electronic logic driver circuit. More specifically, this invention relates to reducing power consumption of electronic logic circuits and the conditioning of signals within electronic logic circuits.

An electronic circuit consumes power in various ways. In particular, power is consumed when input signals to elements of the circuit change state. A contribution to this power consumption occurs because of the charging and discharging of parasitic capacitance associated with the input signals to circuit elements and with wires connecting these input signals to signal drivers. Power dissipation does not occur in the parasitic capacitance itself, but in the output resistance of the signal drivers. A modem digital integrated circuit (IC) typically drives a large number of off-chip signals, which, whilst having high capacitance loading, operate at a relatively low frequency and thus consume a significant (but nevertheless small) portion of the total power consumption of the IC. ICs also include many global on-chip signals, such as clock signals or address lines, which traverse the entire chip driving many internal inputs. These have high parasitic capacitance but in addition operate generally at very high speed. Consequently, such signals can consume a moderately high portion of the total power consumption of the IC. A driver circuit that reduces power dissipation capable of driving such on-chip signals at a speed comparable to conventional on-chip drivers would therefore be highly desirable.

2. Summary of the Prior Art

Referring to the drawings, FIG. 1 shows, for the purpose of illustration, a conventional CMOS IC inverter driver 10 that furnishes a driver output signal VD to an interconnect 12, which in turn furnishes interconnect output signal VO to a load 14. Where the driver 10 is used as an on-chip driver, the load 14 is typically constituted by inputs to further logic devices formed as part of the same IC and the interconnect 12 is formed in on-chip metallization layers. Due to their small dimensions, on-chip interconnects typically have low series inductance. Alternatively, where the driver 10 is used as off-chip driver, the load 14 is typically constituted by input pins to further IC's mounted on the same printed circuit board (PCB) and the interconnect 12 is constituted by a combination of lead-frame conductors within IC packages and conductors etched onto the PCB. Due to relatively large dimensions of PCB conductors, such interconnects have typically have appreciable series inductance.

The inverter driver 10 includes an NMOS transistor M1 serially connected to a PMOS transistor M2 between a positive supply rail VDD and a ground supply rail VSS. Since M1 is turned on by applying a positive voltage to its gate input and $M_2$ is turned on by applying a ground potential to its gate input, normally only one of the two is conductive during steady-state conditions. Therefore, if the input signal $V_C$ is at a 'low' potential (i.e. near VSS potential) then the driver output signal $V_D$ is driven to a 'high' potential (i.e. near VDD potential), and conversely. During transitions of the input signal VC between high and low potentials, there is generally a brief period when both transistors M1 and M2 are simultaneously conductive.

In FIG. 2 there is shown a simplified electrical model of the circuit of FIG. 1. The output of the inverter driver 10 is modelled by a controllable switch SW in series with an output resistance R(ON). The output resistance represents the source-drain resistance of either transistor M1 or M2 in its 'on' condition. A capacitor C(IN) models the input (gate) capacitance of the transistors M1 and M2. The interconnect 12 is modelled by a series resistance RI and a series inductance L1 and a distributed capacitance CI. The distributed capacitance CI is typically smaller than the load capacitance CL so that, to a reasonable degree of accuracy, the distributed capacitance CI can be considered as forming part of load capacitance CL.

FIG. 3a shows how signals VD and VO in FIG. 1 typically change when an input signal VP is driven from 'high' to 'low' when the driver 10 is used as an on-chip driver. In this case, the current flow into load CL is effectively limited by the driver output resistance R(ON), so the driver output signal VD changes approximately exponentially from 'low' to 'high'. Since the interconnect inductance and resistance are comparatively small, the conductor output signal VO is only slightly delayed and overshoot is negligible. FIG. 3b shows how signals VD and VO in FIG. 1 typically change when input signal VP is driven from 'high' to 'low' when the driver 10 is used as an off-chip driver. In this case, the current flow into load CL is effectively determined both by the driver output resistance R(ON) and the interconnect inductance LI. Hence, although the driver output signal VD begins a transition from 'low' to 'high' quite quickly, the interconnect inductance causes the interconnect output signal VO to change in a damped sinusoidal manner with some degree of overshoot.

On-chip signals are generally required to operate at very high speed, therefore a low value of R(ON) is needed. This is achieved by making the channel width of the drive transistors within the driver 10 quite large. This means that the input capacitance C(IN) of driver 10 may be as much as one third the value of load capacitance CL. For the case off-chip drivers, R(ON) typically is made much larger in relative terms to limit the speed of the transition and to reduce the ringing and overshoot that would otherwise occur due to the appreciable inductance of the interconnect. Nevertheless, there is typically some overshoot as shown in FIG. 3b. Since a larger R(ON) is desirable, the channel width of drive transistors within the driver 10 can be made much smaller for a given load capacitance when driver 10 is an off-chip driver. Therefore, in this case the input capacitance C(IN) of the driver 10 is quite small compared to load capacitance CL. In both cases, the energy drawn from the supply (ignoring that used in charging and discharging C(IN)) is approximately equal to $CV^2$, where V is the potential between VDD and VSS and C is the numerical value of CL. Similar waveforms occur when the output goes from 'high' to 'low', but in this case there is no power is drawn from the VDD supply. Therefore, the power drawn from the VDD supply when the output is driven at a frequency f is on average equal to $fCV^2$. Much of this power is dissipated in the driver output resistance R(ON). The power dissipation cannot be reduced merely by making the value of R(ON) smaller since the only effect would be to increase the amount of overshoot and ringing.

In WO-A-97/09783, the present applicant showed that the power dissipation, especially of off-chip drivers, can be reduced typically by 75% by harnessing, as an energy storage mechanism, the ringing that occurs when load 14 is driven via an appreciable inductance such as PCB interconnect inductance. This was accomplished by replacing the driver 10 by an alternative driver 18 as shown in FIG. 4, in which the driver output voltage changes from 'low' to 'high' and vice versa, through an intermediate voltage. An input signal VC to the driver 18 feeds a control circuit that generates control signals V5, V6 and V7, which in turn connect, to the gate electrodes of NMOS transistors M3 and M4 and a PMOS transistor M5 respectively. The drain connections of these transistors M3, M4 and M5 are all connected to the output VS of the driver 18. The transistors M3 and M5 can connect the output signal VS to VSS and VDD respectively whilst the transistor M4 can connect the output to an intermediate voltage VHH. Generally, the transistor M4 is designed to have a lower 'on' resistance than either of the transistors M3 or M5 (or M1 or M2 in FIG. 1 when the driver 10 is used as an off-chip driver). The output signal VS is also connected to the load 14 via a PCB interconnect 12, which has been modelled as an inductor LR.

FIG. 5 shows the waveform that would result if signals $V_S$ and $V_O$ have been previously charged to a steady state VSS potential by the transistor M3 having been turned on, but with the transistor M3 now being turned off. At time t1, the transistor M4 is turned on indefinitely. The output VS of the driver moves quickly to VHH potential. Because the transistor M4 has a low 'on' resistance, the voltage of the interconnect output signal VO overshoots VHH potential and reaches almost the potential of VDD, and thereafter rings sinusoidally with a resonant frequency f(r) given by Equation 1.1 below.

$$f(r) = \frac{1}{2\Pi\sqrt{LC}} \quad (1.1)$$

The current passing through the transistor M4 alternates in direction and also causes a very small voltage drop across the transistor M4, causing the output voltage VS of the driver to deviate slightly from VHH potential. Since a small amount of power is dissipated in the transistor M4 and in the also in the various loss mechanisms associates with the load, the amplitude of oscillations gradually decreases.

FIG. 6 shows how, if the sinusoidal oscillation depicted in FIG. 5 can be arrested at time t2 (i.e. after half of one complete oscillation). The required transition of interconnect output signal VO can be achieved with very low power dissipation. The driver output signal VS is held at or near VHH potential until the interconnect output signal VO reaches a first maximum. Then the potential of the signal VS is raised to that of VDD by switching off the transistor M4 and switching on the transistor M5. FIG. 6 also shows the required sequence of control signals V5, V6 and V7 in response to the input V1 for LOW-to-HIGH and HIGH-to-LOW transitions. The driver 18 then furnishes an output signal VS in the form of a two-step rising or falling staircase. By exploiting resonance between the interconnect inductance LR and load CL, this allows the interconnect output signal VO to largely complete each conductor output transition while the VS signal is held at an intermediate level. This means that greatly reduced current is drawn from the power supply. This general technique will be called "staircase resonant" driving of capacitive loads in this specification.

The staircase resonant driver 18 is useful for driving off-chip signals that have a relatively slow rise time and have inherent series inductance sufficient to produce resonance. On-chip signals generally have low inductance but on-chip inductors (for example spiral trace inductors) could be explicitly provided to furnish the required resonance inductance. However, on-chip signals must generally be driven at a speed typically an order of magnitude faster than off-chip signals. The peak current flowing in the transistor M4 in FIG. 4 is therefore an order of magnitude higher driving an on-chip load capacitance compared with driving the same off-chip load capacitance so that the "ON" resistance of the transistor M4 is made an order of magnitude lower to achieve the same level of resonant overshoot. Of course, the "ON" resistance of the transistor M4 can be reduced by increasing its channel width; but after a point it requires an excessive power consumption to operate or switch transistor M4 due to its increased gate capacitance such that the overall power dissipation is increased contrary to the desired effect which is to decrease overall power dissipation.

The driver 18 is may be unsuitable for driving high-speed on-chip signals because the transistor M4 has an "ON" resistance that is too high in relation to the power taken to switch it on and off. This is partly because the maximum gate-source voltage applied to the transistor M4 between times t1 and t2 in FIG. 6 is only half of the power supply voltage and because the time of rise and fall of the control signal V is now similar to the desired conductor output rise/fall time and the average gate-source voltage is even lower. Furthermore, the control voltage V makes two transitions corresponding to each transition of the output. This further limits the channel width of the transistor M4 that can be used without leading to excessive power consumption.

There is therefore a desire to provide a driver circuit having the low power advantages of the driver 18 whilst being capable of driving on-chip signals at high speed.

SUMMARY OF THE INVENTION

From a first aspect, the invention provides an electronic driver circuit for a capacitive load comprising switching devices to switch current either to or from two main voltage supply sources; and two coupled inductors that act to store energy derived from the voltage sources; wherein the coupled inductors form an LC resonator with the load such that energy stored in the inductors can be transferred to or from the load to drive a change in the voltage of the load.

Use of the coupled inductors as a repository for stored energy reduces the amount of energy that the driver must draw from its power supply.

A resonant inductor may be connected to a common point between the coupled inductors. The resonant inductor may supplement or substitute for the inductance of the driven load.

In one class of embodiments, the coupled inductors are connected in series with one another. For example, the coupled inductors may be connected in series across the main voltage supply sources, being connected thereto by the switching devices.

Alternatively, they may be coupled magnetically without a direct electrical interconnection.

Embodiments of the invention may be suitable for driving two loads with complementary signals. Such embodiments are may be constructed in accordance with the last-preceding paragraph.

One or both of the voltage sources is (or includes) a voltage supply rail. Alternatively, one or both of the voltage sources may include a reservoir capacitor maintained at a potential at or near a main supply rail.

In typical embodiments, one or more of the switching devices may include a MOSFET. In such embodiments, approximately the full allowable gate drive voltage can be applied to the switches, so reducing their "on" resistance. For example, a switching device may be a MOSFET inverter. Alternatively or additionally, a switching device may include one or more diode through which energy may return to the power supply.

Whilst in typical embodiments of the invention, the load(s) can be connected to one or both voltage sources via one or more coupled inductors and one or more switching devices, some embodiments may also include a clamp circuit comprising further switching devices which can directly connect or clamp the load to one or other main voltage supply rail during intervals between changing the voltage of the load(s).

A driver embodying the invention may further comprise an energy recovery inductor connected to couple with the coupled inductors. Typically, the energy recovery inductor has a greater number of turns than either of the coupled inductors.

In a driver circuit embodying the invention, the output of the driver may include a clamp circuit. This enables the output to be clamped to a target output voltage.

A driver circuit embodying the invention is typically implemented in an integrated circuit for driving a load on or off the integrated circuit.

The coupled inductors typically connect to or constitute part of the inductance in an LC resonator formed with the load. Most typically, the coupled inductors form a substantial part of the inductance of the LC resonator.

A driver embodying the invention may further comprise an energy recovery inductor connected to couple with the coupled inductors. In such embodiments, the energy recovery inductor typically has a greater number of turns than either of the coupled inductors.

In an efficient configuration, one or more inductors of a circuit embodying the invention is at least partially constituted by an interconnect, for example, an interconnect that connects a chip to an external device.

Typical embodiments of a driver circuit embodying the invention are driven by first and second input signals. Each of the input signals typically controls a respective one of the switching devices, each input signal having an active state and an inactive state. The waveform of the second driver signal may be a time-shifted function of the waveform of the first driver signal. Alternatively, the waveform of the second driver signal is in the inactive state only within a period in which the first driver signal is in the active state.

By a method utilizing mutual electromagnetic induction of EMF (electromotive force) in least two coupled inductors, an applied voltage approximately equal to the supply voltage can be shared or split between two inductors in an efficient manner to generate the half supply voltage step needed to produce a staircase waveform. This avoids the need to switch current to or from a source of intermediate voltage supply via a switching device and consequently further avoids the high resistive losses that occur in a prior art method of "staircase resonant driving". This is particularly so when such a switching device comprises a MOSFET with a limited gate-source drive voltage due to the source electrode being connected to a source of intermediate voltage supply and the gate drive voltage being limited to a voltage level between the two main supply rails.

Embodiments of the invention may further avoid the need to generate a very short enabling pulse otherwise needed to enable the flow of current to or from a source of intermediate supply voltage corresponding approximately to the desired output signal transition time. The output signal transition time corresponds to an overlap period in which at least two switch enabling pulses of relatively long duration are simultaneously active only during output signal transitions. Furthermore, each enabling pulse typically makes only one transition corresponding to each output transition. This may provide major advantages in relation to a prior art "staircase resonant" driver when it is desired to drive signals with fast rise time and low power consumption. The principles of the invention can be embodied in either a single polarity driver with a single output or a complementary polarity driver with dual outputs being logical complements. By magnetically coupling (in appropriate polarity) complementary signals via coupled inductors, the latter has the further advantage of generating a signal and its logical complement with a high degree of passive coupling and with transition of both the signal and its complement initiated by the same control input signal, thus allowing much lower skew than is possible using an active device to generate the logical complement of a signal.

More specifically, a single output driver designed to embody the present invention, may comprise a staircase generator which, in response to one or more control inputs, generates a staircase output signal connected serially via a resonance inductor to an output load and optional output clamp circuit which when present is also responsive to one or more input signals. Typically, the load is substantially capacitive and is constituted by the combined parasitic input capacitances of one or more logic gate inputs driven by the driver. When the combined load capacitance is physically close to the driver, the load may often be approximated to reasonable degree of accuracy simply by a capacitor. When the load capacitance is remote from the driver (for example, an on-chip driver in combination with either an off-chip load capacitance or an on-chip load capacitance connected via an on-chip interconnect of appreciable length) the load may be represented to a reasonable degree of accuracy by a small inductor in series in series with a small resistor, in turn in series with the load capacitance (capacitor); the inductor representing the inductance of the interconnect and the resistor representing the resistance of the interconnect. The staircase generator circuit may have an output inductance that is effectively in series with the resonance inductor. This reduces the required value of the resonance inductor and can often be made sufficiently large to perform an equivalent function to the resonance inductor such that the resonance inductor function is incorporated into the staircase generator. No physical resonance inductor is therefore required. Similarly, when the load comprises a capacitance with a small series inductance, the required value of output inductor can be made slightly smaller to compensate for this. For clarity, the operation of the driver can most easily be explained taking the case where the load is represented purely by a capacitor and the staircase generator has a very low output inductance.

In the absence of an optional clamp circuit, the single output driver functions as follows. Assume that both the load and the staircase generator are at a low voltage level (VSS), but it is desired to change the voltage of the load to a high level VDD, in response to one or more input signals. The staircase generator output voltage first moves quite quickly to an intermediate voltage level with a potential that is approximately mid-way between VSS and VDD. The action of the resonance inductor is initially to limit the flow of current from the staircase generator to the capacitive load. As the current builds, the voltage at the load begins to change in a resonant sinusoidal manner consistent with a resonant frequency determined by the values of the load capacitance and the resonance inductor. The rate of change of load voltage reaches a maximum approximately when load voltage equals the intermediate voltage level, at which point about half of the energy supplied by the staircase generator has been used in charging the load capacitance. Some energy has been dissipated as heat due to various resistances and non-idealities, but a large remaining portion has been stored in the resonance inductor. The staircase output voltage remains approximately at the intermediate voltage for a further period of time, during which the energy stored in the inductor enables the load voltage to considerably overshoot the intermediate voltage level almost reaching the level of VDD, but with much lower expenditure of energy than in a conventional inverter driver. At approximately the point of maximum overshoot, in response to one or more control inputs, the staircase generator output voltage changes to from the intermediate voltage level to that of VDD causing the load voltage to completely reach the level of VDD with some small amount of overshoot and ringing. During this final phase of the transition, the staircase generator effectively supplies extra energy, which replenishes any energy dissipated during the transition. Alternatively, the dissipated energy is largely supplied from the optional clamp circuit, which, in response to one or more input signals, connects the load to VSS via a switch that is released before the transition and then reconnects the load via a second switch to VDD after the transition.

From a second aspect, the invention provides an integrated circuit incorporating a driver circuit according to any preceding claim.

Typically, embodiments of the invention may reduce the power consumption by up to 70% compared the conventional inverter driver.

From a further aspect, the invention provide an electronic driver circuit for driving a capacitive load between supply potentials comprising a. switching devices to switch current either to or from two voltage supply sources; b. resonance inductance c. two coupled inductors that act to store and/or transfer energy derived from the voltage sources; wherein the coupled inductors and resonance inductor form part of an LC resonator with the load such that stored energy can be resonantly exchanged between the inductors and the voltage supply source and the load to drive a change in the voltage of the load.

A portion of the resonance inductance may be provided by a resonance inductor and/or by the coupled inductors.

BRIEF DESCRIPTION OF THE DRAWINGS

FIG. 1 shows a conventional CMOS IC inverter driver, and has already been discussed;

FIG. 2 shows a simplified electrical model of the circuit of FIG. 1, and has already been discussed;

FIGS. 3a and 3b are diagrams illustrating the changes with time of signals in the driver of FIG. 1, and have already been discussed;

FIG. 4 shows an improved known driver, as has already been discussed;

DESCRIPTION OF THE PREFERRED EMBODIMENTS

Figure 5:
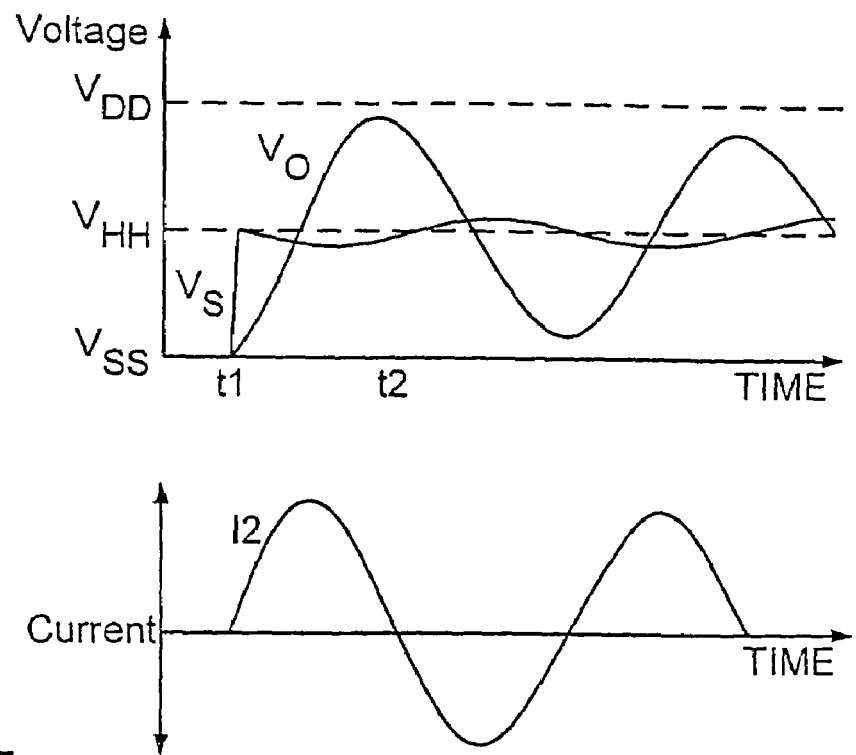
FIGS. 5 and 6 are diagrams illustrating the changes with time of signals in the driver of FIG. 4, and have already been discussed
Figure 6:
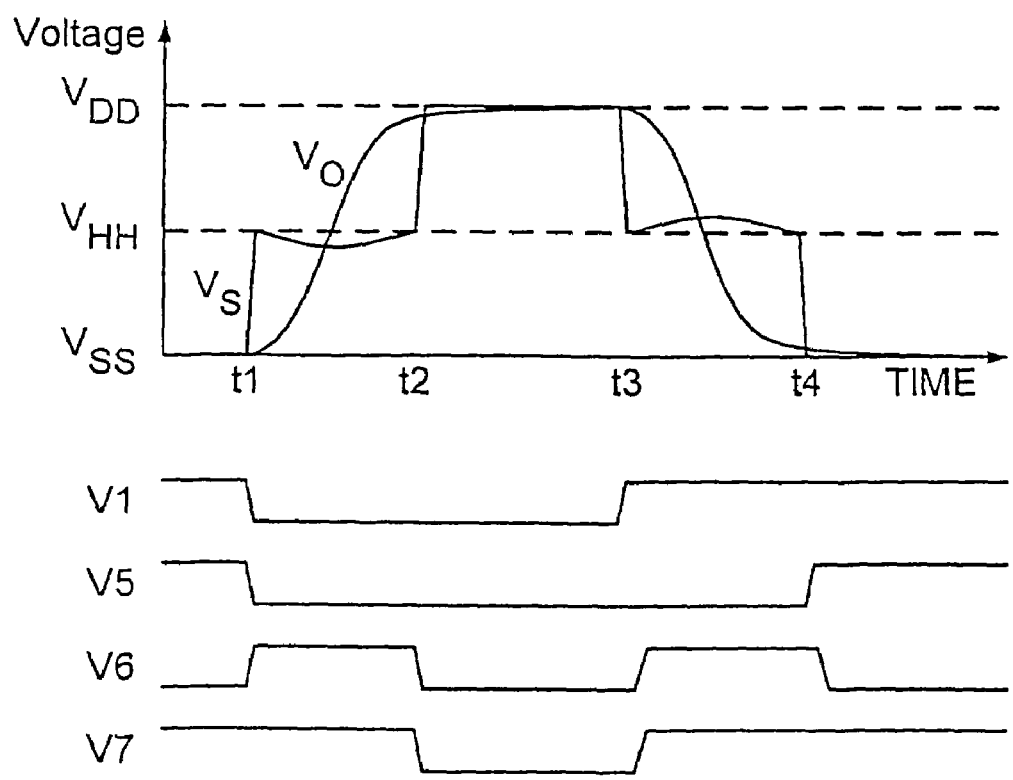
Figure 7:
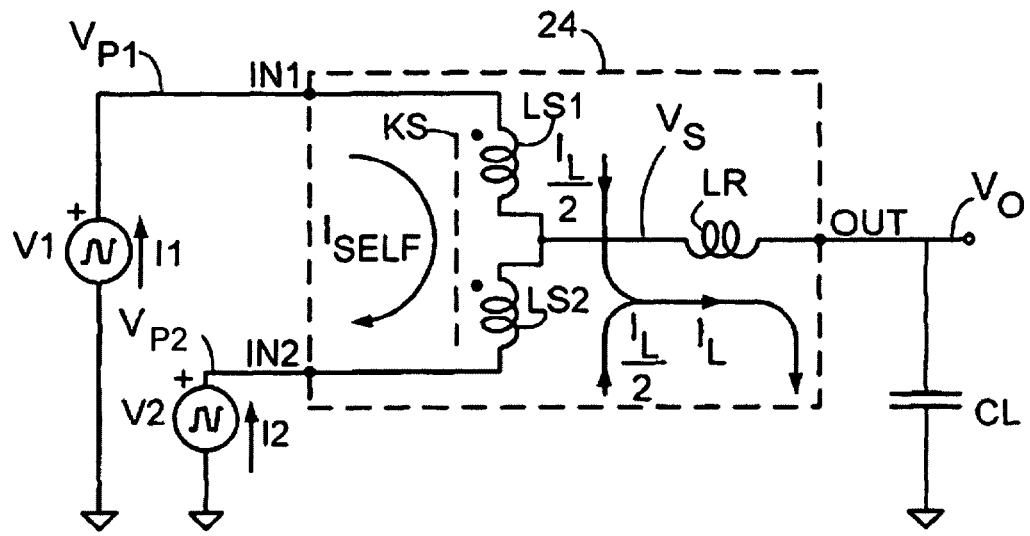
FIG. 7 is a simplified diagram of a driver being a first embodiment of the invention.

Referring first to FIG. 7, a simplified embodiment will be described. For the purpose of clarity in explaining the principles of the invention, this drawing omits various active switching devices, clamp circuits, reservoir capacitors and diodes (all being familiar to those skilled in the technical field) which variously are typically required to make practical use of the invention and which are described below. FIG. 7 illustrates how full swing input signals can be used in conjunction with a purely passive circuit comprising coupled inductors to produce the half-swing step of a staircase output waveform.

The circuit in FIG. 7 comprises an inductor circuit 24, two independent time varying voltage supply sources V1 and V2, and a load capacitor CL. The inductor circuit 24 has two input terminals IN1 and IN2 and a single output terminal OUT. The outputs terminals of time varying voltage supply sources V1 and V2 are connected to input terminals IN1 and IN2 respectively of an inductor circuit 24 and supply time varying voltage signals VP1 and VP2, respectively. Output terminal OUT of inductor 24 is connected to a first terminal of the load capacitance CL, the voltage across the load capacitor CL being denoted by VO. The reference terminals of time varying voltage supply sources V1 and V2 and the second terminal of load capacitor CL are all connected to a common circuit ground node. To assist in understanding the operation of inductor circuit 24 it is helpful to consider the current flows within it as being the superposition of a first component of current flow ISELF flowing from input terminal IN1 to input terminal IN2 and a second component of current flow IL flowing from the output terminal OUT. The inductor circuit 24 comprises two series-connected staircase generator inductors LS1 and LS2 of equal self-inductance and strongly coupled by mutual inductance with a coefficient of mutual coupling KS. For the purpose of clarity, it is assumed that the value of KS closely approaches unity, corresponding to nearly 100% mutual coupling. Therefore, when a rate of change of current in the inductor LS1 causes an EMF to be induced by self-inductance in its winding, an equal EMF is also induced by mutual inductance in the windings of the other inductor LS2; the converse also being the case. As indicated by polarity dots in FIG. 7, these induced EMFs are additive and reinforcing around the circuit loop corresponding to the current flow ISELF indicated in FIG. 7. The inductors LS1 and LS2 are connected serially between input voltage signals $V_{P1}$ and $V_{P2}$ respectively. (In this configuration, it may assist understanding to consider the series combination of inductors LS1 and LS2 either as a single inductor with a centre tap or as an auto-transformer with centre tap.) The centre tap or circuit node joining inductors LS1 and LS2 furnishes an input signal $V_S$ to a first terminal of a resonance inductor LR, the other terminal of which furnishes an output signal $V_O$ to a load capacitance $C_L$. Initially, at time $t_0$ both $V_{P1}$ and $V_{P2}$ are at ground potential, as are all other circuit nodes, and no current is flowing. Therefore, the load capacitance $C_L$ is fully discharged and $V_O$ at a low voltage level (0 volts with respect to the ground node).

Figure 8:
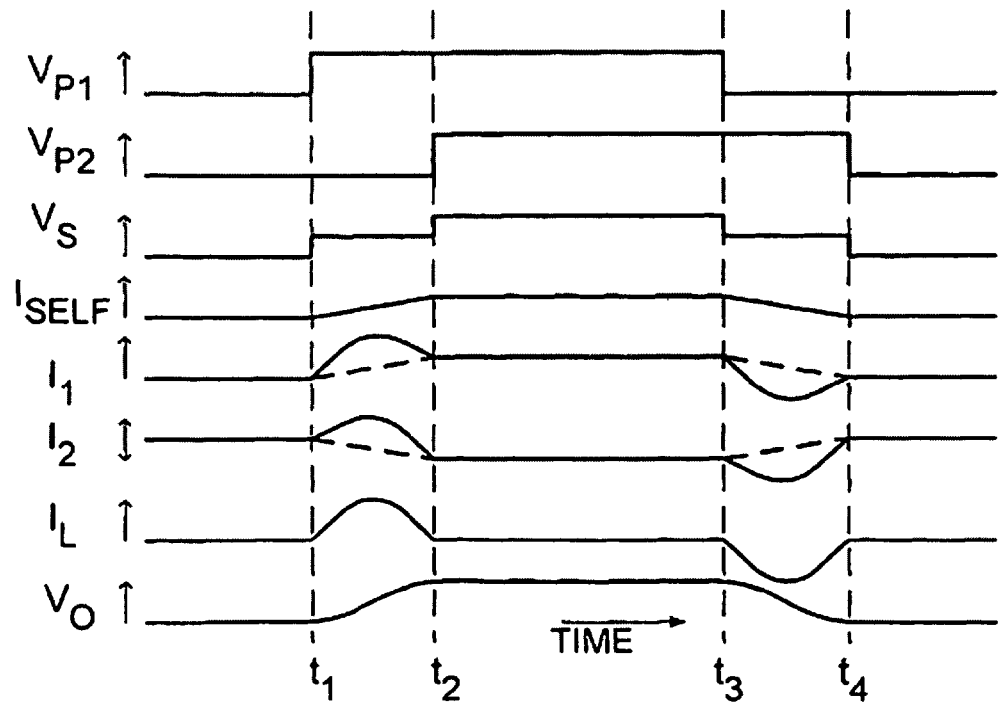
FIG. 8 is a diagram illustrating the changes with time of signals in the driver of FIG. 7.

Assume that it is now desired to charge load capacitance $C_L$ to a high voltage level (for example, 1 volt). At time t1, the input signal $V_{P1}$ goes from 0 volts to 1 volt while the output signal $VP_2$ is at 0 volts. Following this time, the behaviour of the circuit is determined by the superposition of two separate current flows $I_{SELF}$ and $I_L$ (the latter being the current in the resonance inductor $L_R$) as indicated in FIG. 7. First, imagining $L_R$ and $C_L$ are disconnected from inductors LS1 and LS2, the latter two act together as if they formed as a single inductor connected between the outputs of the sources V1 and V2 and the current $I_{SELF}$ begins to build under the influence of voltage applied by V1. Because the inductors LS1 and LS2 are connected in series, and further coupled by mutual inductance, the self-inductance of LS1 and LS2 combined is about four times the value of either LS1 or LS2 alone. Consequently, their inductance is quite high and the rate at which $I_{SELF}$ increases is quite low and in particular, much lower than would be the case in the absence of the mutual coupling. $I_{SELF}$ increases linearly with time as shown in FIG. 8. With $L_R$ and $C_R$ disconnected, it is clear merely by considering the symmetry of the inductors LS1 and LS2 that together they form a voltage divider, so $V_S$ assumes a potential midway between VP1 and VP2 (at 0.5 volts, in this example).

As a result of the very tight mutual coupling between the inductors LS1 and LS2, the same holds true even when the symmetry is broken by considering the effects of $L_R$ and $C_R$ as connected, and a current $I_L$ flows from the centre tap connection. Whatever voltage is induced in the inductor LS1 is also induced in the other inductor LS2 and vice versa. Therefore, the initial half-swing step in a staircase voltage has been generated from the full swing change of VP1. Under the influence of this staircase voltage $V_S$, a current $I_L$ starts to build so as to charge the output capacitance $C_L$, initially limited by resonance inductor $L_R$. In this idealised case, resistive losses are negligible, so the voltage $V_O$ builds in an undamped resonant sinusoidal manner, with a resonant frequency f(r) given by Equation 1.1 above. The current $I_L$ reaches a maximum when $V_O$ rises to the level of $V_S$ (0.5 volts). The energy stored in the inductance $L_R$ allows voltage $V_O$ to overshoot $V_S$ and sinusoidally reach the level of 1 volt at time t2 whereupon the current $I_L$ has once again fallen to zero. If $V_S$ were to remain at 0.5 volts, then $V_L$ would once again begin to fall sinusoidally and oscillate as such indefinitely (in the absence of any resistive element). However, at time t2, VP2 also goes form 0 volts to 1 volt, and consequently $V_S$ goes from 0.5 volts to 1 volt, effectively arresting the oscillation with load capacitance $C_L$ charged to 1 volt, as desired. The timing of the transition of signal $V_{P2}$ at time t2 in relation to the transition $V_{P1}$ at time t1 is assumed to have been arranged to coincide approximately with the completion of the transition of the signal $V_O$, being when signal $V_O$ is reaches a first maximum voltage near to 1 volt.

During the period from t1 to t2, $I_L$ (the current charging $C_L$) is supplied equally by the voltage sources V1 and V2 in a direction from V1 and V2 to the load capacitance $C_L$ (although superimposed is current $I_{SELF}$ as indicated in FIG. 8). This may be somewhat counter-intuitive, since the potential of V2 is at all times less than $V_L$. It results because the 0.5 volt EMF induced in the inductor LS1 is of a polarity to subtract from V1 but the 0.5 volt EMF induced in the inductor LS2 adds to the voltage of V2, allowing current to be 'pumped up' from V2. The result is that during the transition of output signal VO, substantially all of the energy supplied by V1 is transferred to stored energy in the load capacitance $C_L$. The remainder of the energy is stored as a residual persistent current flow $I_{SELF}$, which has been set up in the inductors LS1 and LS2. The value of this current flow $I_{SELF}$ can be made arbitrarily small by making the inductance of LS1 and LS2 very high without otherwise affecting the operation of the circuit (although in a practical implementation, the series resistance of the inductors LS1 and LS2 would become unacceptably high at some point). In certain embodiments, the current $I_{SELF}$ can be returned to zero by the following high-to-low voltage transition of VO as shown in FIG. 8 beginning at time t3 and ending at time t4.

Detailed accounting of energy supplied and received by V1 and V2 would show a net zero expenditure of energy over a complete cycle compared with an expenditure of $CV^2$ for a conventional inverter driver where C is the value of $C_L$ and V equals the peak-to peak transition amplitude of the output i.e. 1 volt.

Figure 9:
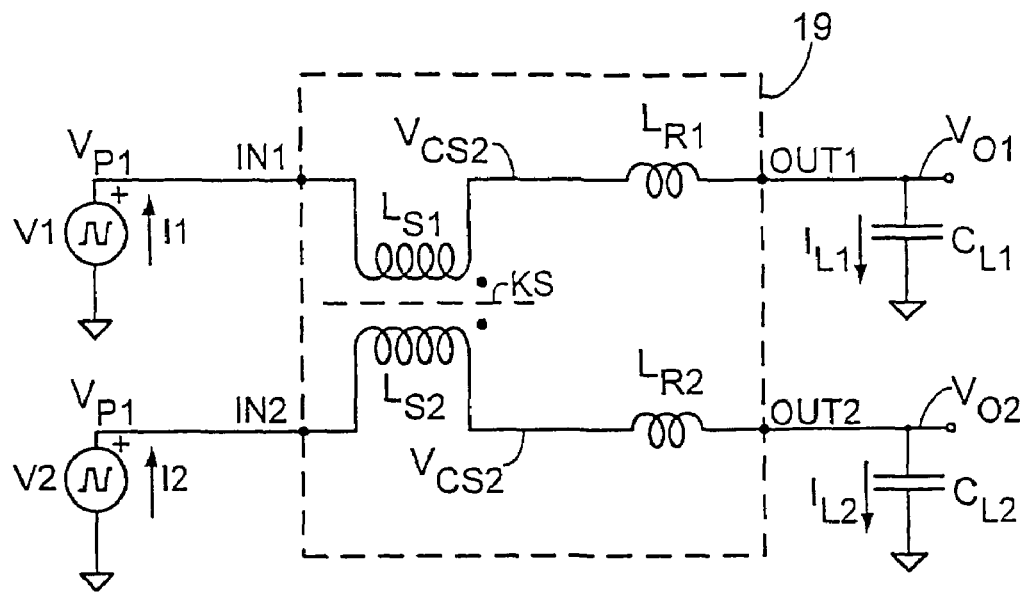
FIG. 9 is a simplified diagram of a driver being a second embodiment of the invention.
Figure 10:
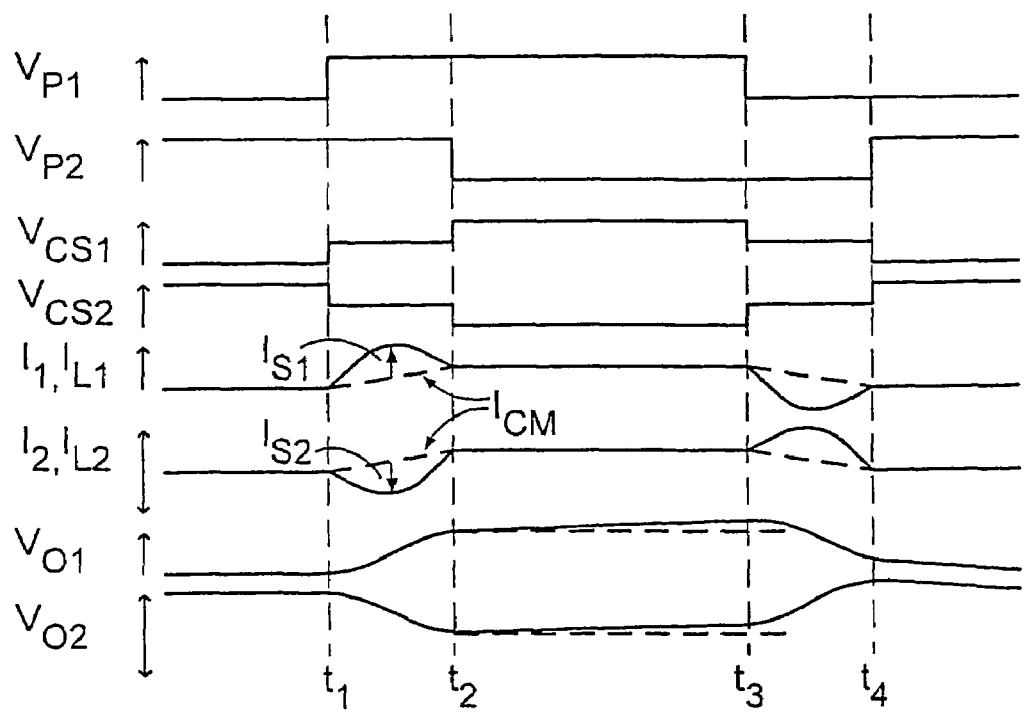
FIG. 10 is a diagram illustrating the changes with time of signals in the driver of FIG. 9.

The circuit of FIG. 9 shows how the same principle can be applied to drive two equal capacitive loads $C_{L1}$ and $C_{L2}$ with complementary signals. The circuit comprises time varying voltage sources V1 and V2 connecting via inductor circuit 19 to load capacitors CL1 and CL2 respectively. The inductor circuit 19 has input terminals IN1 and IN2 and output terminals OUT1 and OUT2. The inductor circuit 19 connects the time varying voltage source V1 to the load capacitor CL1 via a first current path from the input terminal IN1 to the output terminal OUT1, consisting of the series combination of staircase generating first mutually coupled inductor LS1 and first resonance inductor LR1. The inductor circuit 19 similarly connects the time varying voltage source V2 to the load capacitance CL2 via a similar second current path from the input terminal IN2 to output terminal OUT2, consisting of the series combination of a staircase generating second mutually coupled inductor LS2 and a second resonance inductor LR2. The inductors LS1 and LS2 are tightly coupled by mutual inductance with a coefficient of mutual coupling KS. For the purpose of clarity, it is assumed that the value of KS closely approaches unity, corresponding to nearly 100% mutual coupling. Although magnetically coupled, the first and second current paths are electrically isolated. In FIG. 9, the respective output voltages of voltage sources V1 and V2 are denoted by $V_{P1}$ and $VP_2$ respectively and the respective voltages across load capacitors CL1 and CL2 are denoted by $V_{O1}$ and $V_{O2}$ respectively. Initially the input and output voltages $V_{P1}$ and $V_{O1}$ associated with the first capacitive load are at a low voltage while the input and output voltages $V_{P2}$ and $V_{O2}$ associated with the second capacitive load are at a high voltage. When, at time t1, as shown in FIG. 10, VP1 goes from a low voltage to a high voltage an approximately sinusoidal current $I_{L1}$ builds, flowing from the voltage source V1 to load $C_{L1}$. Due to the tight coupling between LS1 and LS2, a nearly equal and opposite current $I_{L2}$ is set up discharging load $C_{L2}$. At time t2, when $C_{L1}$ and $C_{L2}$ have been respectively charged and discharged, VP2 goes to 0 volts, which arrests the sinusoidal resonance, in a manner similar to that which occurs in the case of the single output driver of FIG. 7. Again, the timing of the transition of signal $V_{P2}$ at time t2 in relation to the transition $V_{P1}$ at time t1 is assumed to have been arranged to coincide approximately with the completion of the transition of signal $V_O$, being when signal $V_O$ is reaches a first maximum voltage near to 1 volt. Voltage and current waveforms occurring in relation to the operation of the circuit of FIG. 9 are shown in FIG. 10. In particular the waveforms for current flows $I_{L1}$ and $I_{L2}$ show how they can be considered as approximately sinusoidal signal components of current flow $I_{S1}$ and $I_{S2}$ respectively, superimposed on a common mode component of current flow, $I_{CM}$. Common mode component current $I_{CM}$ causes a residual current flow to persist similar to that described in relation to FIG. 7, which tends to cause a continuing common-mode oscillation of $V_{O1}$ and $V_{O2}$. This problem can be overcome. Moreover, the magnitude of the common mode current is greatly reduced because the effect of the mutual coupling between LS1 and LS2 is to increase their apparent inductance in relation to any common mode current flowing within them. It is important to note that both complementary signal transitions are initiated by the single event of $V_{P1}$ going to a high voltage, therefore the timing skew between $V_{O1}$ and $V_{O2}$ is quite small, which is desirable for many applications.

Figure 11:
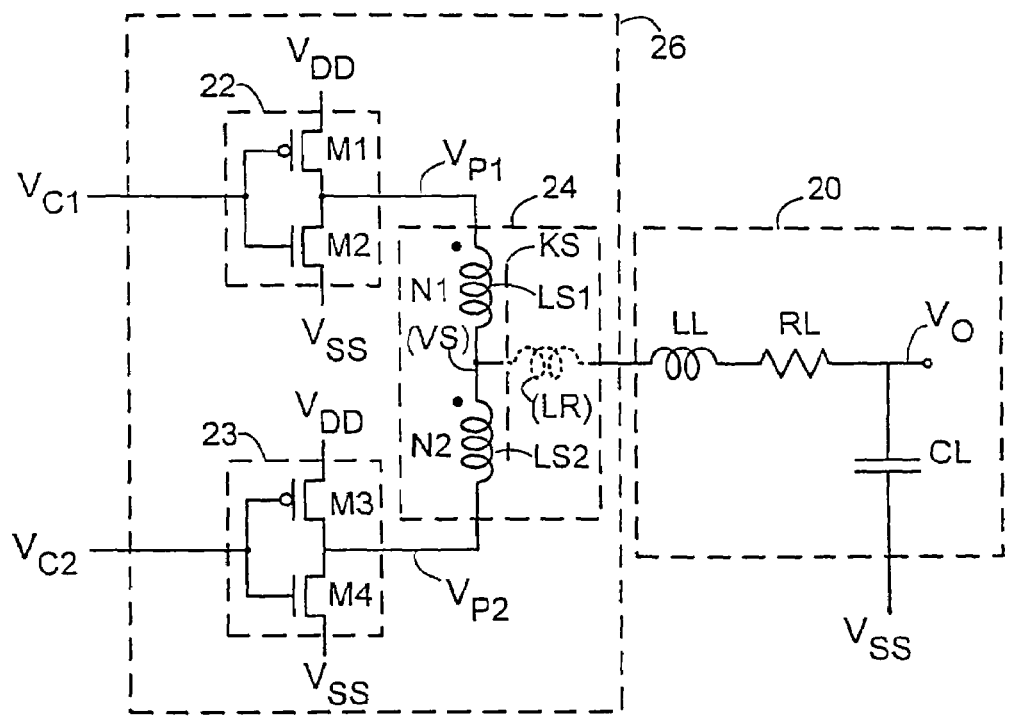
FIG. 11 is a diagram of a driver being a third embodiment of the invention.

FIG. 11 shows a driver 26, being a practical single output driver embodiment of the invention, with its output connected to a load 20. The load 20 illustrates the case where the load capacitance is physically remote from driver 26 and connected via an interconnect with series inductance and resistance $L_L$ and $R_L$ respectively. The operation of the driver 26 is similar to that described in relation to the circuit of FIG. 7, the main difference being that signals $V_{P1}$ and $V_{P2}$ are supplied by CMOS inverter circuits 22, 23 comprising MOS transistors M1, M2, M3, M4 as shown. The driver further includes an inductor circuit 24 that comprises two staircase generator inductors LS1, LS2 and a resonance inductor LR. The resonance inductor LR is shown in dotted lines in FIG. 11 to indicate that its function may be equivalently provided by reducing the coupling factor K of LS1 and LS2 from near to 100% to a lower value that depends upon the inductance values of LS1 and LS2 in relation to the value of LR that it is desired to replace. The lower the coupling factor the larger the effective value of LR. Thus, LR can effectively be replaced by the "leakage inductance" of LS1 and LS2. A signal ($V_S$) has been bracketed to indicate that it is a notional signal when LR is replaced by leakage inductance.

Figure 12:
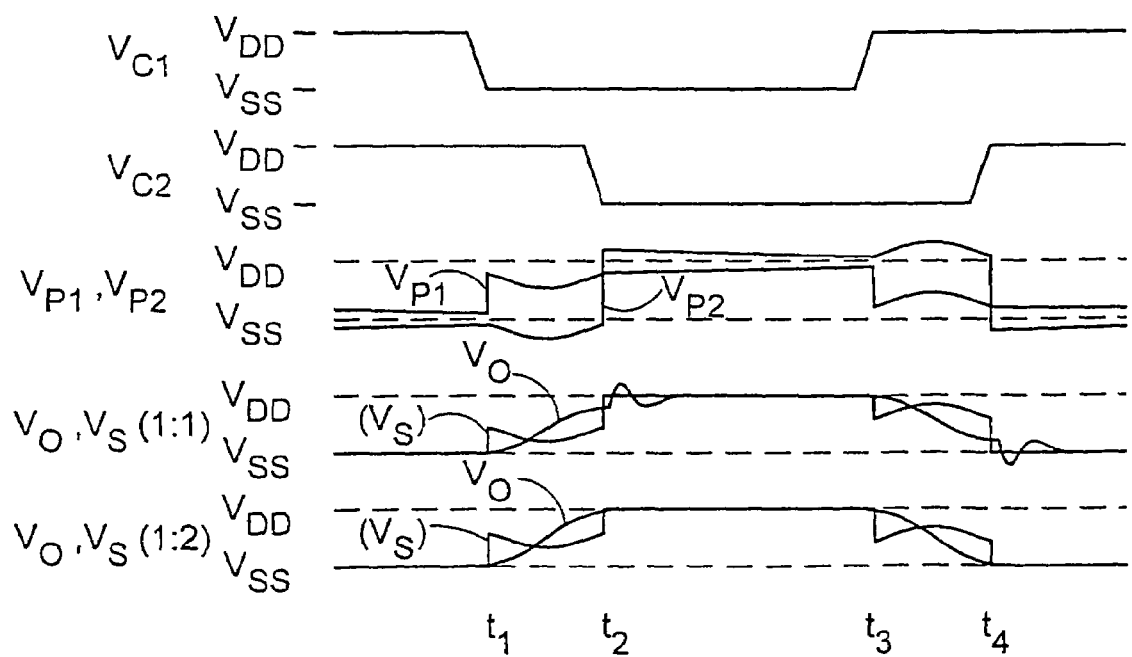
FIG. 12 is a diagram illustrating the changes with time of signals in the driver of FIG. 11.

The waveforms that occur in relation to the driver 26 are shown in FIG. 12 and are similar to those shown in FIG. 8.

Since the signals $V_{P1}$ and $V_{P2}$ now derive from CMOS inverters, which have noticeable output resistance and not idealized voltage sources as in FIG. 7, both exhibit a sinusoidal dip during output transitions from t1 to t2 and from t3 to t4. Also, the residual current flow between the transitions causes $V_{P1}$ and $V_{P2}$ to be displaced slightly from the associated supply rail potential immediately following transitions at time t2 and t4 and to approach the rail potentials exponentially as the current decays due to resistive losses in the CMOS inverters 22, 23. Because of these losses, the staircase voltage ($V_S$) is not quite midway between $V_{DD}$ and $V_{SS}$ during output transitions as ideally required. This, and the fact that the load 20 has some series resistance RL, means that the output voltage $V_O$ does not quite achieve a full amplitude swing while ($V_S$) is at the intermediate level, this causing some ringing at the end of the transition as shown in FIG. 12. The turns ratio of the inductors LS2 and LS1 (N2:N1) can be adjusted to compensate for losses by making $V_S$ follow $V_{P1}$ more closely than $V_{P2}$. By increasing the turns ratio to 2:1, the waveform is generally improved as shown.

Figure 13:
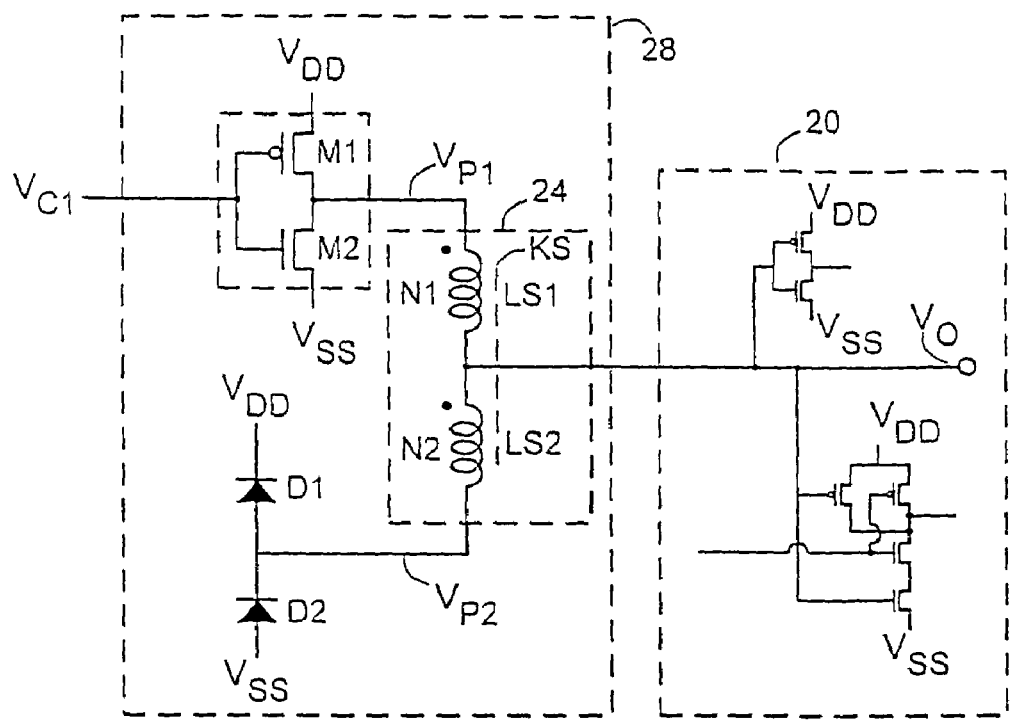
FIG. 13 is a diagram of a driver being a fourth embodiment of the invention, modified from the driver of FIG. 11.
Figure 14:
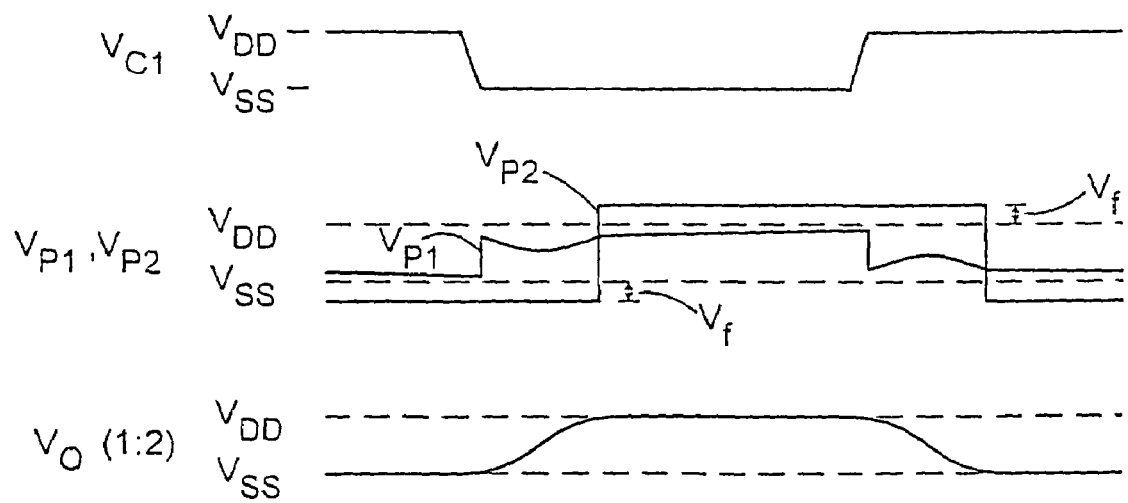
FIG. 14 is a diagram illustrating the changes with time of signals in the driver of FIG. 13.

In FIG. 12, it can be seen that direction of current flow that occurs because of the signal $V_{P2}$ via the CMOS inverters 22, 23 is always such as to return current to the circuit power supply via $V_{DD}$ and $V_{SS}$. Therefore, the inverter 23 can be replaced with diodes connected to the load 20, as is the case in driver 28 shown in FIG. 13. In this example, the load 20 is shown as being constituted by the combined parasitic capacitance of various CMOS gates being driven by the signal VO on the same chip. Similar waveforms occur in this example as have been described within the driver 26 except that the potential of signal $V_{P2}$ is determined by the forward drop $V_f$ of the diodes in relation to the power rail voltages as shown in FIG. 14. A particular advantage of this configuration is that it has only one input signal $V_{P1}$ and is self-timed; diodes D1 & D2 allowing the internal signal $V_{P2}$ to transition automatically at the nearly the same time as $V_O$ completes it transition, thus simplifying the provision of input signal for driver 28 when compared to driver 26. Once again, a non-unity turns ratio normally gives superior output waveforms.

Figure 15:
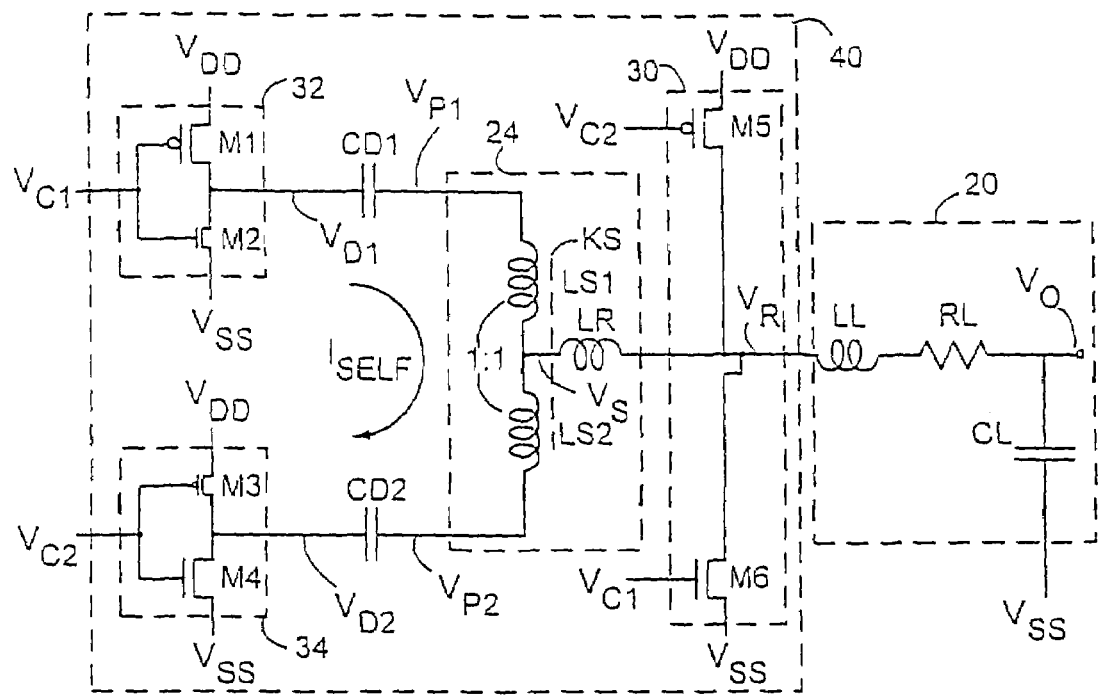
FIG. 15 is a diagram of a driver being a fifth embodiment of the invention, modified from the driver of FIG. 13.

Turning to FIG. 15, there is shown a driver 40 comprising CMOS inverters 32, & 34, an inductor circuit 24 (with unity turns ratio) and a clamp circuit 30. A driver 26 appears similar to driver 26 of FIG. 11, but in this case, it is supplied with input control signals $V_{C1}$ and $V_{C2}$ that drive CMOS inverters 32, 34 with an alternative timing sequence that is highly efficient.

The CMOS inverter 32 includes a PMOS transistor M1 and an NMOS transistor M2. Operation of this embodiment is such that the inverter 32 is used primarily in a "pull-up" mode. Therefore, in terms of minimizing the resistive losses in driver 40, it is the "ON" resistance of the transistor M1 that is of primary concern. Thus, by increasing the channel width of the transistor M1 and reducing the channel width of M2 lower resistive losses result without increasing the input capacitance of driver 40. Similarly, the CMOS inverter 34, which includes a PMOS transistor M3 and NMOS transistor M4, is used primarily in a "pull-down" mode and the channel width of the transistor M4 can be increased and the channel width of the transistor M3 decreased. The sequencing of control inputs $V_{C1}$ and $V_{C2}$ is such that, during output transitions when current flow through the inverters 32, 34 is at a maximum, the transistors M1, M4 are conducting whereas the transistors M2, M3 are non-conducting. Therefore, resistive losses are kept low. The inverters 32, 34 drive output signals $V_{D1}$, $V_{D2}$ that connect via series DC blocking capacitors $C_{D1}$, $C_{D2}$ respectively to signals $V_{P1}$, $VP_2$ being the inputs to the inductor circuit 24 as before. The blocking capacitors $C_{D1}$, $C_{D2}$ are needed to prevent the average DC voltage that exists between signals VD1 and VD2 from causing a large and wasteful DC component of $I_{SELF}$ through the inductors LS1, LS2. The blocking capacitors $C_{D1}$, $C_{D2}$ are made quite large in value compared with the load capacitance $C_L$. Therefore, the input signals $V_{P1}$, $V_{P2}$ are DC shifted versions of $V_{D1}$, $V_{D2}$ shifted such that $I_{SELF}$ has no DC component, as shown in FIG. 16.

Figure 16:
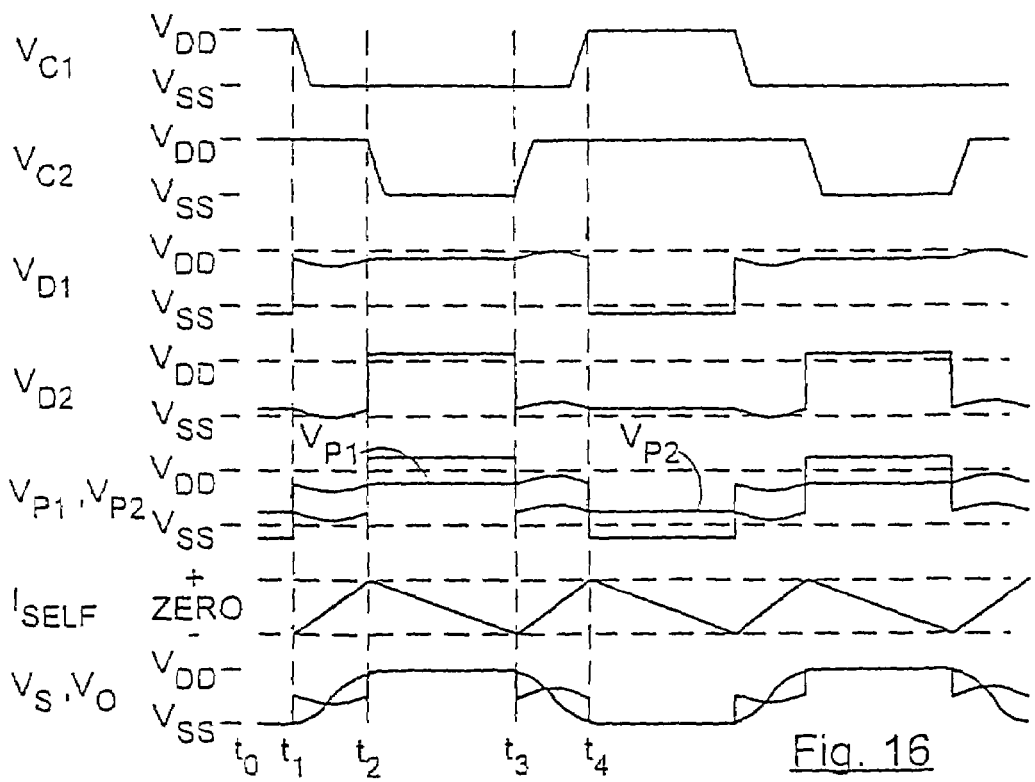
FIG. 16 is a diagram illustrating the changes with time of signals in the driver of FIG. 15.

At time t0 in FIG. 16, $V_{P1}$ and $V_{P2}$ are symmetrically disposed about the voltage level of VSS and therefore signal $V_S$ and $V_O$ are also at VSS. In addition, a clamp circuit 30, which is constituted by a PMOS transistor M5 connected in series with an NMOS device M6 holds signal $V_R$ (and, since the values of LL and RL are small, therefore also VO) at VSS. Since $V_{C1}$ is "high" and the transistor M6 is conductive, whilst $V_{C2}$ is also "high" and the transistor M5 is non-conductive. At time t1, the signal $V_{C1}$ goes "low" and the clamp circuit 30 releases the signal $V_R$ whilst at the same time causing $V_{P1}$ to move "high" (near to the potential of VDD) and the staircase voltage $V_S$ to increase to a voltage approximately midway between VDD and VSS. At a time t2, the signal $V_{C2}$ goes "low" and signal $V_{P1}$ goes "high", such that both $V_{P1}$ and $V_{P2}$ are symmetrically disposed about the potential of VDD. Therefore, the staircase voltage Vs also moves to the level of VDD. The signals $V_R$ and $V_O$ move sinusoidally towards the level of VDD as before, but due to resistive losses would not actually reach the level of VDD. At the same time (t2), the PMOS transistor M5 in the clamp circuit 30 becomes conductive and pulls signals $V_R$ and $V_O$ to the level of VDD thus replenishing any dissipated energy. During the output transition, the current $I_{SELF}$ increases, but as shown, between transitions it decreases due to the reversal of potential between signals $V_{P1}$ and $V_{P2}$. A similar sequence begins at time t3, causing the transition of the output signal $V_O$ from "high" to "low".

Figure 17:
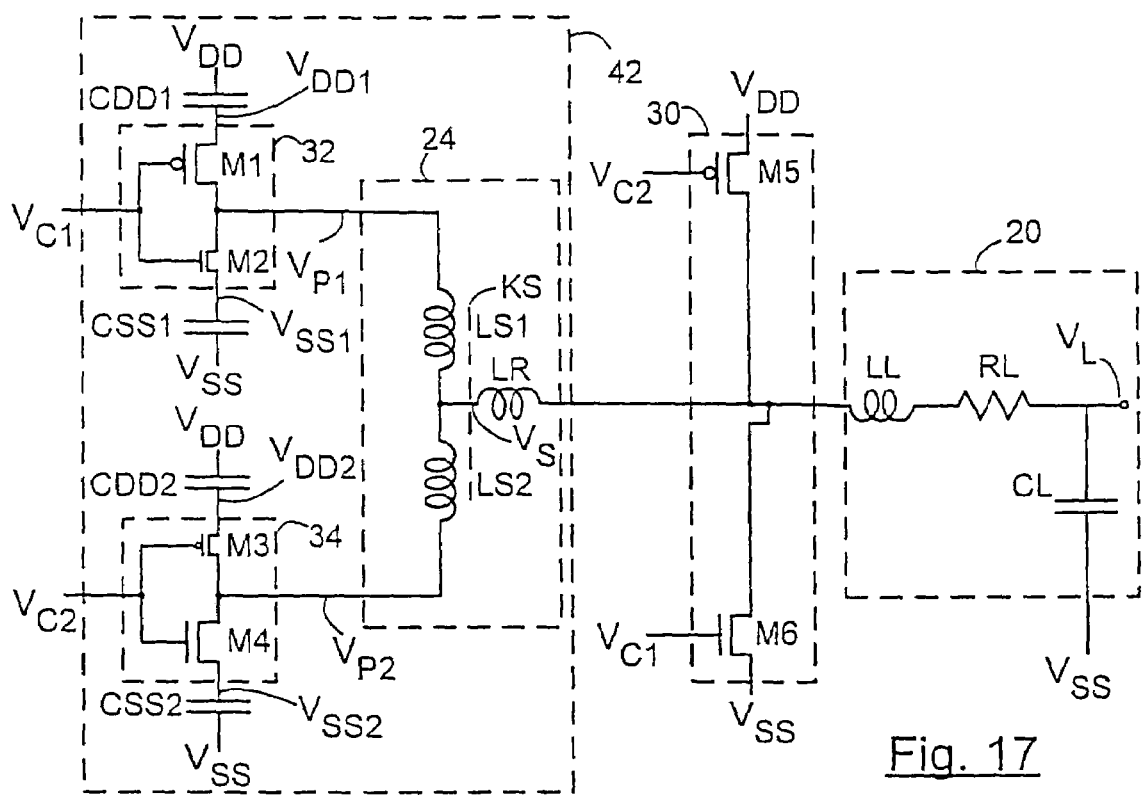
FIG. 17 is a diagram of a driver being a sixth embodiment of the invention.
Figure 18:
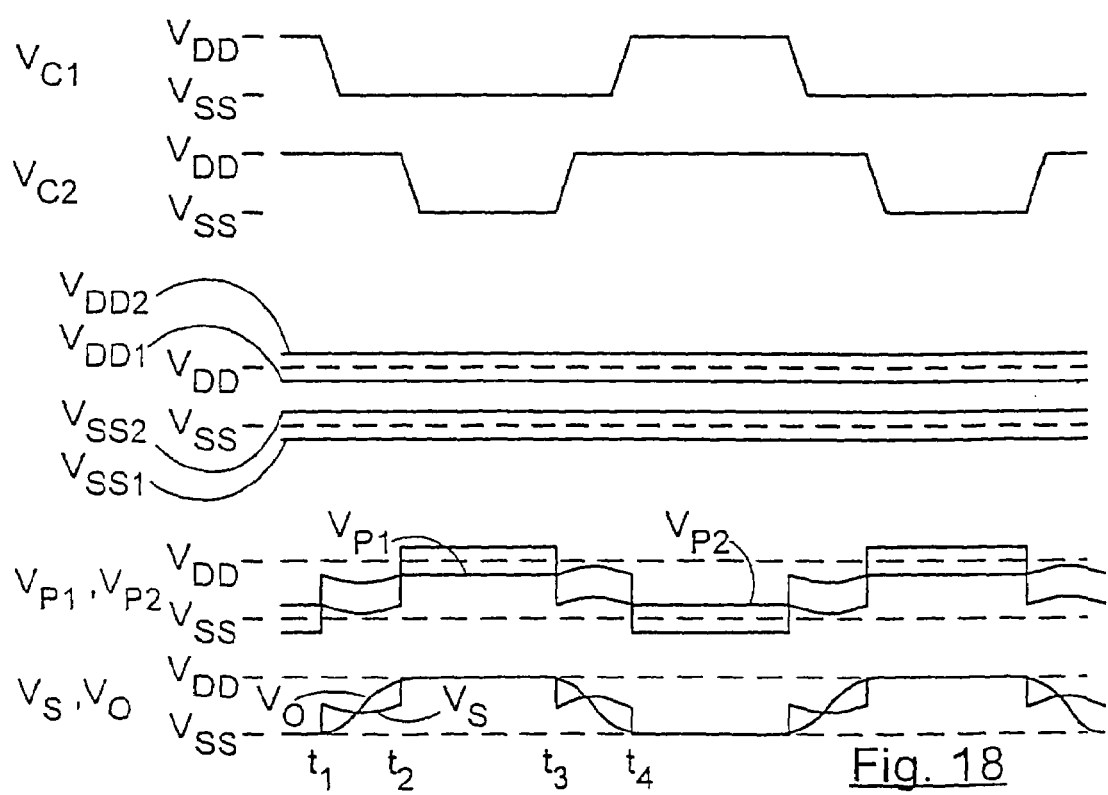
FIG. 18 is a diagram illustrating the changes with time of signals in the driver of FIG. 17.

In the embodiment of FIG. 17, a driver 42 is shown that operates in a very similar manner to the driver 40 described above. In this embodiment, the DC blocking capacitors CD1, CD2 of FIG. 15 are replaced by DC blocking capacitors CDD1, CSS1, CDD2 and CSS2 such that a CMOS inverter 32 directly switches between DC shifted supply rails $V_{SS1}$ and $V_{DD1}$ and a CMOS inverter 34 switches between DC shifted supply rails $V_{SS2}$ and $V_{DD2}$ as shown. Thus, the input signals $V_{P1}$ and $V_{P2}$ in FIG. 17 are similar to the signals $V_{P1}$ and $V_{P2}$ of FIG. 15. The remainder of the circuit operates in the manner described in the previous paragraph. The advantage of the driver 42 of this embodiment is that it does not require floating capacitors, which can be difficult to fabricate on a standard CMOS chip.

Figure 19:
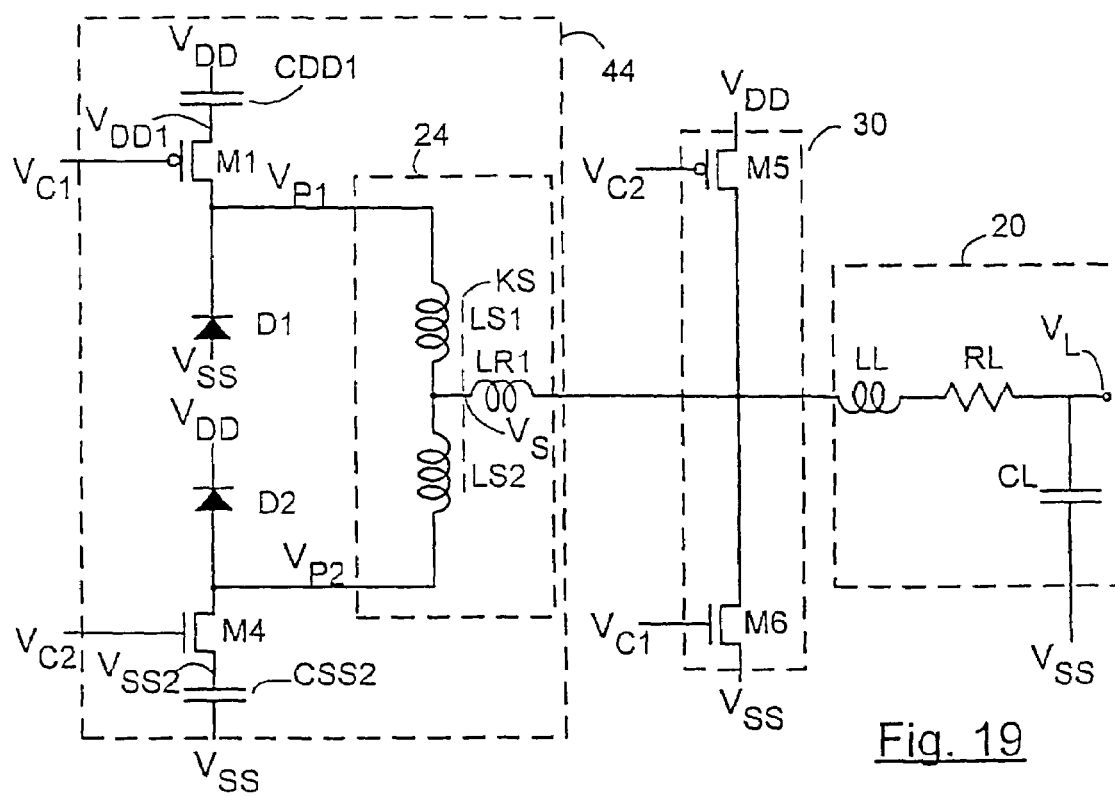
FIG. 19 is a diagram of a driver being a seventh embodiment of the invention.
Figure 20:
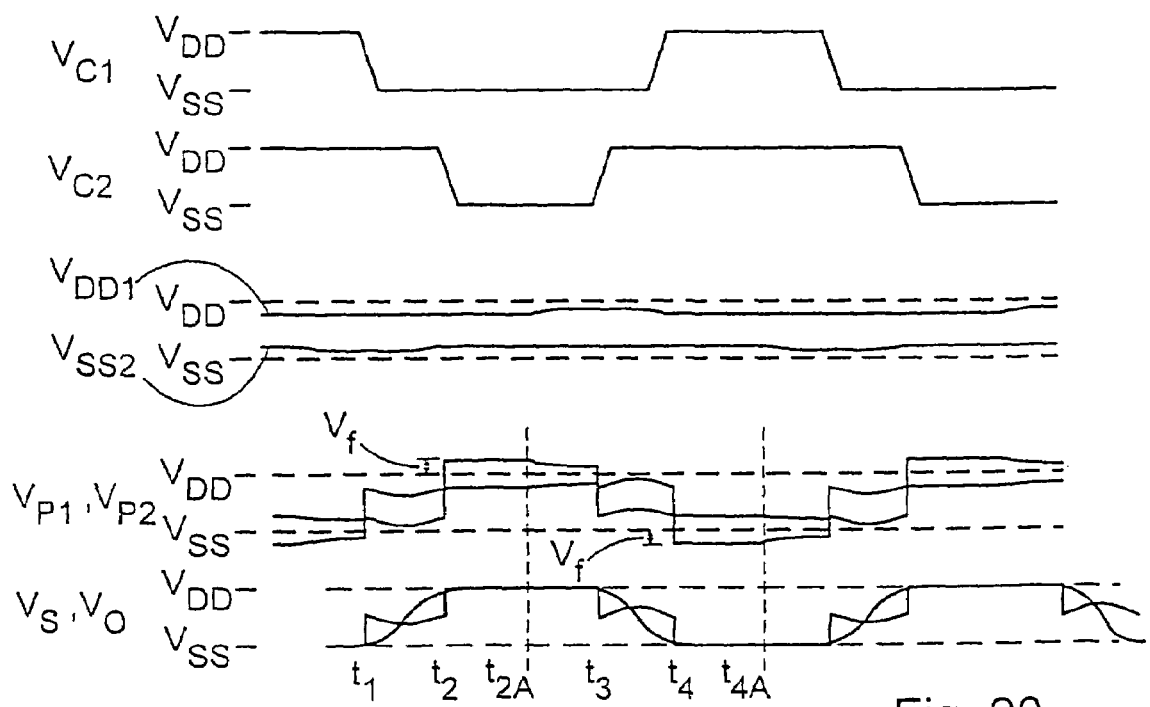
FIG. 20 is a diagram illustrating the changes with time of signals in the driver of FIG. 19.

FIG. 19 shows a driver 44, a variation of the driver 42 of the preceding embodiment, in which the transistors M2 and M3 are replaced by diodes D1, D2 connected directly to the supply rails $V_{DD1}$, $V_{DD2}$. This arrangement has the advantage of further reducing the input capacitance at the expense of some dissipation between transitions as the current $I_{SELF}$ dissipates stored energy by flowing across the forward voltage drop (Vf) of diodes D1 and D2. After the output transition phase between t1 and t2, the current $I_{SELF}$ slowly diminishes and approaches zero, causing signals $V_{P1}$ and $V_{P2}$ to converge towards the level of the $V_{DD}$ supply after time $t_{2A}$. In other respects, the driver 44 function in the same way as the drivers 40 and 42 previously described.

Figure 21:
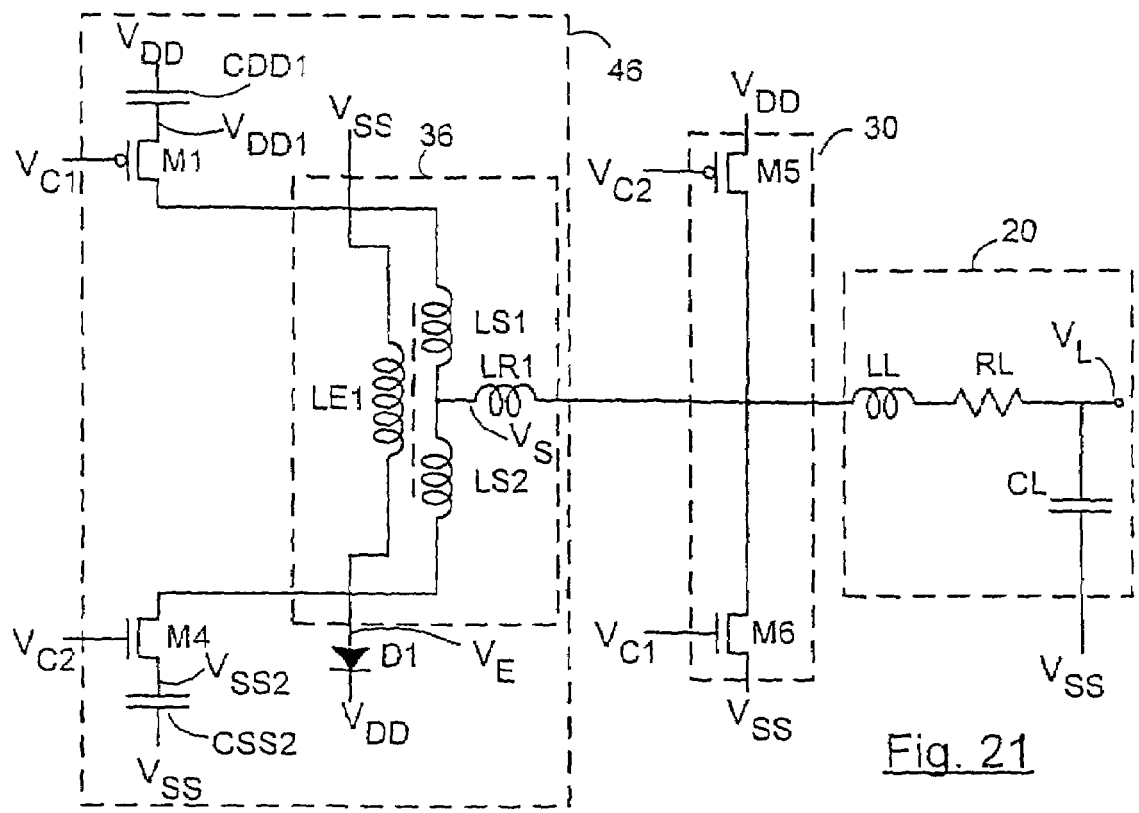
FIG. 21 is a diagram of a driver being a eighth embodiment of the invention.
Figure 22:
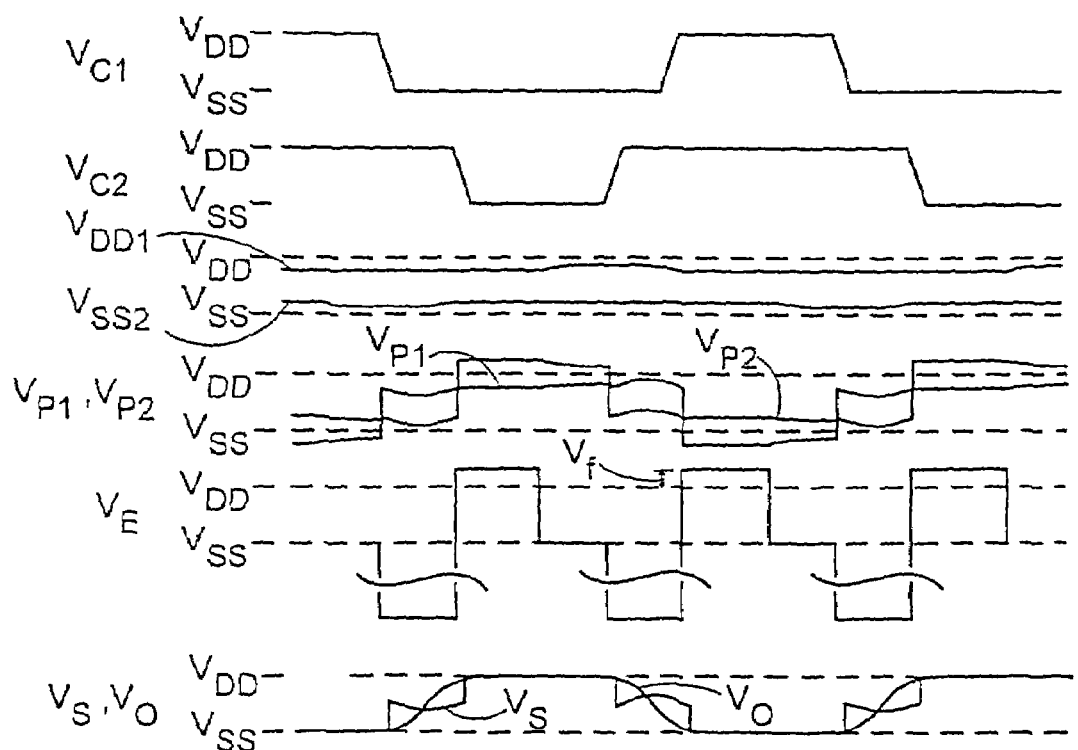
FIG. 22 is a diagram illustrating the changes with time of signals in the driver of FIG. 21.

The embodiment of FIG. 21 shows a driver 46, being a variation on the driver 44, in which $I_{SELF}$ is reduced to zero after each transition in a more energy efficient manner by coupling inductors LS1 and LS2 to a separate energy recovery inductor LE1 which has more many more turns than LS1 and LS2 combined. During the output transition phase, due to the high turns ratio, a high voltage is induced in LE1 that causes a signal $V_E$ to go to a much lower voltage than $V_{SS}$. Because the diode D1 is reverse biased, no current flows in the inductor LE1. After the transition phase, the diode D1 goes into forward bias and the energy stored in the inductors LS1 and LS2 is largely returned to the power supply by LE1.

Figure 23:
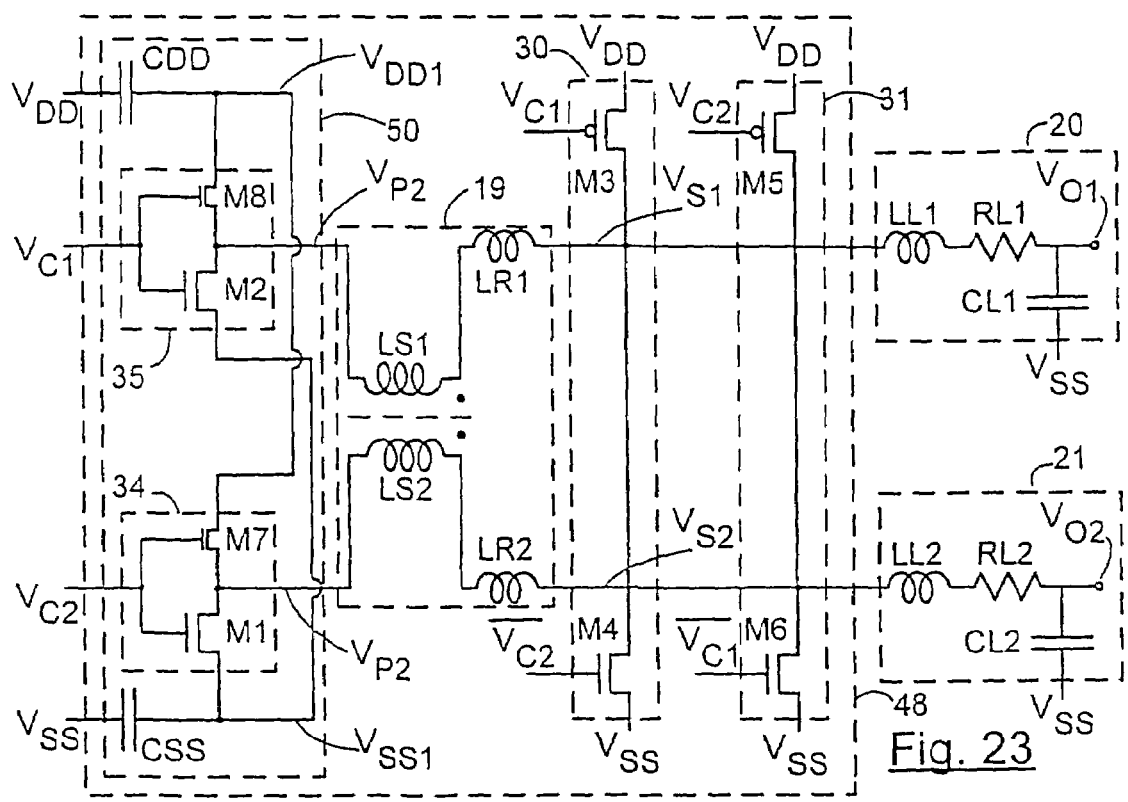
FIG. 23 is a diagram of a driver being a ninth embodiment of the invention.
Figure 24:
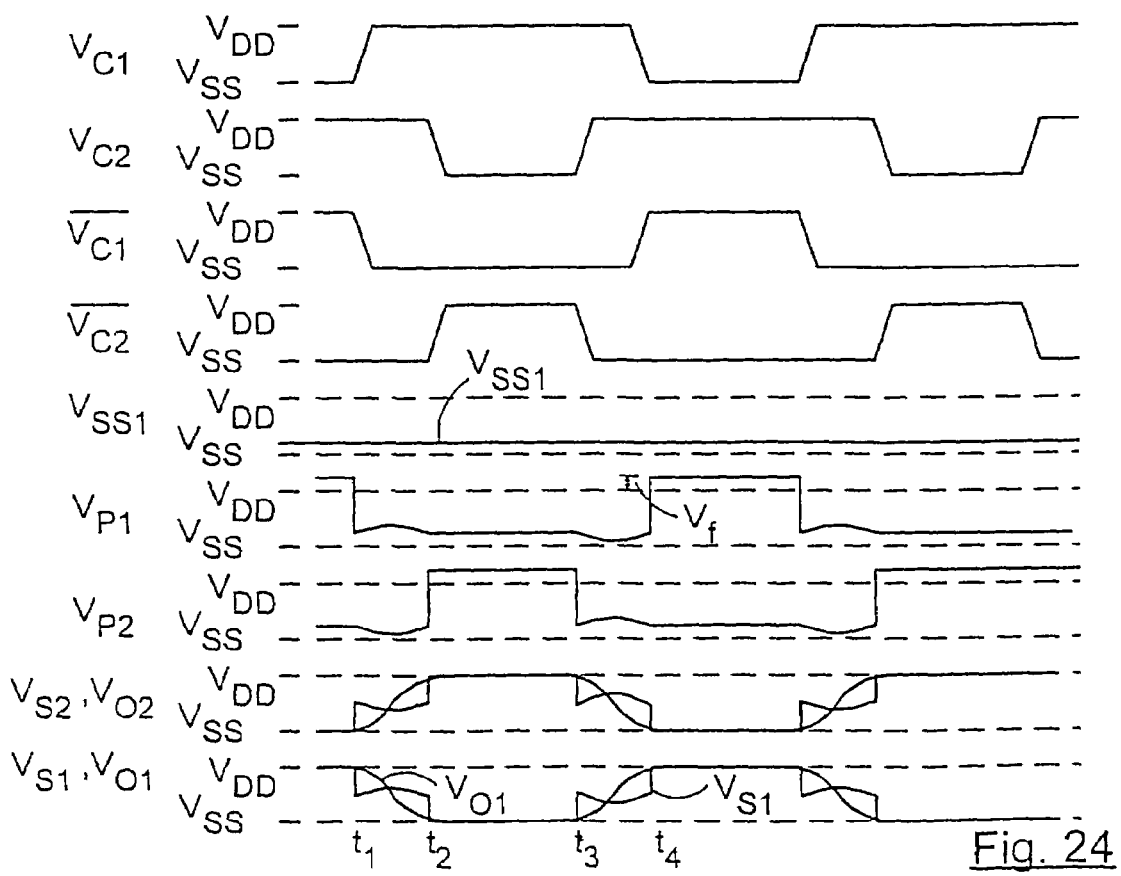
FIG. 24 is a diagram illustrating the changes with time of signals in the driver of FIG. 23.

FIG. 23 shows an embodiment having a driver 48 which an example of a complementary output embodiment of the invention. The driver 48 receives four input signals, namely $V_{C1}$, and $V_{C2}$ and their logical complements $/V_{C1}$ and $/V_{C2}$ and drives two similar loads 20 and 21, furnishing complementary output signals $V_{O1}$ and $V_{O2}$ respectively. The driver 48 comprises a switching circuit 50, further comprising CMOS inverters 34 and 35, switching between DC shifted supply rails VSS1 and VDD1 derived from input voltage supply sources VSS and VDD via DC blocking capacitors CSS and CDD respectively. The CMOS inverter 34 comprises transistors M1 and M7 while CMOS inverter 35 comprises transistors M2 and M8. The driver 48 further comprises identical clamp circuits 30 and 31 which in response to input signals $V_{C1}$, $V_{C2}/V_{C2}$ and $/V_{C2}$ can clamp the inputs to loads 20 and 21 to either of the input voltage source VSS or VDD. Loads 20 and 21 connect to switching circuit 50 via coupled inductor circuit 19. Inductor circuit 19 connects the output of the CMOS inverter 35 to a first load 20 via a first current path consisting of the series combination of staircase generating the first mutually coupled inductor LS1 and the first resonance inductor LR1. The inductor circuit 19 similarly connects the output of the CMOS inverter 34 to a second load 21 via an similar second current path consisting of the series combination of a staircase generating second mutually coupled inductor LS2 and second resonance inductor LR2. The inductors LR1 and LR2 and shown in dotted lines to indicate that their function may be equivalently provided by a leakage inductance from LS1 and LS2 when their coupling factor K is less than unity. Referring to FIGS. 23 and 24, the circuit functions as follows: at time t0, $V_{O1}$ is clamped to VSS via LL1 and RL1 by a transistor M3 and $V_{O2}$ is clamped to VDD via LL2 and RL2 by transistor M6. The input signal VC1 to CMOS inverter 34 is "high" and therefore its output signal VP1 is connected to the offset voltage source VSS1 via a transistor M2. The input signal $V_{C2}$ to the CMOS inverter 35 VC1 is "low" and therefore its output signal VP2 is connect to the DC shifted supply rail VDD1 via the transistor M1. As shown in FIG. 24, the DC shifted supply rails VSS1 and VDD1 stabilize such they maintain a slight positive offset from input voltage sources VSS and VDD. At time t1, both clamp circuits 30 are released and the transistor M2 becomes conducting while the transistor M1 remains conducting. Although nearly the full supply voltage now appears between the load voltage $V_{O1}$ and the $V_{SS1}$ supply voltage to which it is connected via the transistor M1, the inductor LS1, and the resonance inductor LR1, the effect of mutual coupling between the inductors LS1 and LS2 is to share the applied voltage. This has the effect of reducing the EMF that is tending to discharge $V_{O1}$ by half the supply voltage and increase the EMF tending to charge $V_{O2}$ by the same amount. Thus, two staircase signals $V_{S1}$ and $V_{S2}$ result, and via the resonance inductances LR1 and LR2, the two outputs change sinusoidally as previously. The outputs are clamped at the end of the transition by the associated clamp circuit 30. Significantly, both staircase signals are initiated by the same input signal event; $V_{C1}$ going "high". The reverse transitions are initiated at time t3 when $V_{C2}$ goes "high". The circuit is quite efficient in that the current for all transitions is substantially switched via a transistor M1 or M2, both of which are NMOS devices, which normally have a lower "ON" resistance than a PMOS device of the same size and input capacitance.

As described in relation to FIG. 9, current flows through the inductors LS1 and LS2 can be considered as approximately sinusoidal signal components of current flow $I_{S1}$ and $I_{S2}$ respectively, superimposed on a common mode component of current flow, $I_{CM}$. In the case of the circuit of FIG. 9, the signal VP1 and VP2 are both at a low level during all transitions of VO1 and VO2 causing the magnitude $I_{CM}$ to rise steadily during those transitions. By switching VP1 and VP2 between the DC shifted supply rails VSS1 and VDD1, a small positive voltage is applied between transition, the effect of which is to cause $I_{CM}$ to decrease slowly between transitions thus limiting the value $I_{CM}$ to quite a low level.

The physical implementation of any of the embodiments described might comprise either on-chip coupled inductors and resonance inductor formed as spiral trace inductors or simple lengths of track utilizing mutual coupling between adjacent parallel lengths of track to form coupled inductors. In the latter case, the inductors become part of the distribution network of the circuit of which the driver forms a part. The inductor component could equally be formed in off-chip components.

Figure 25:
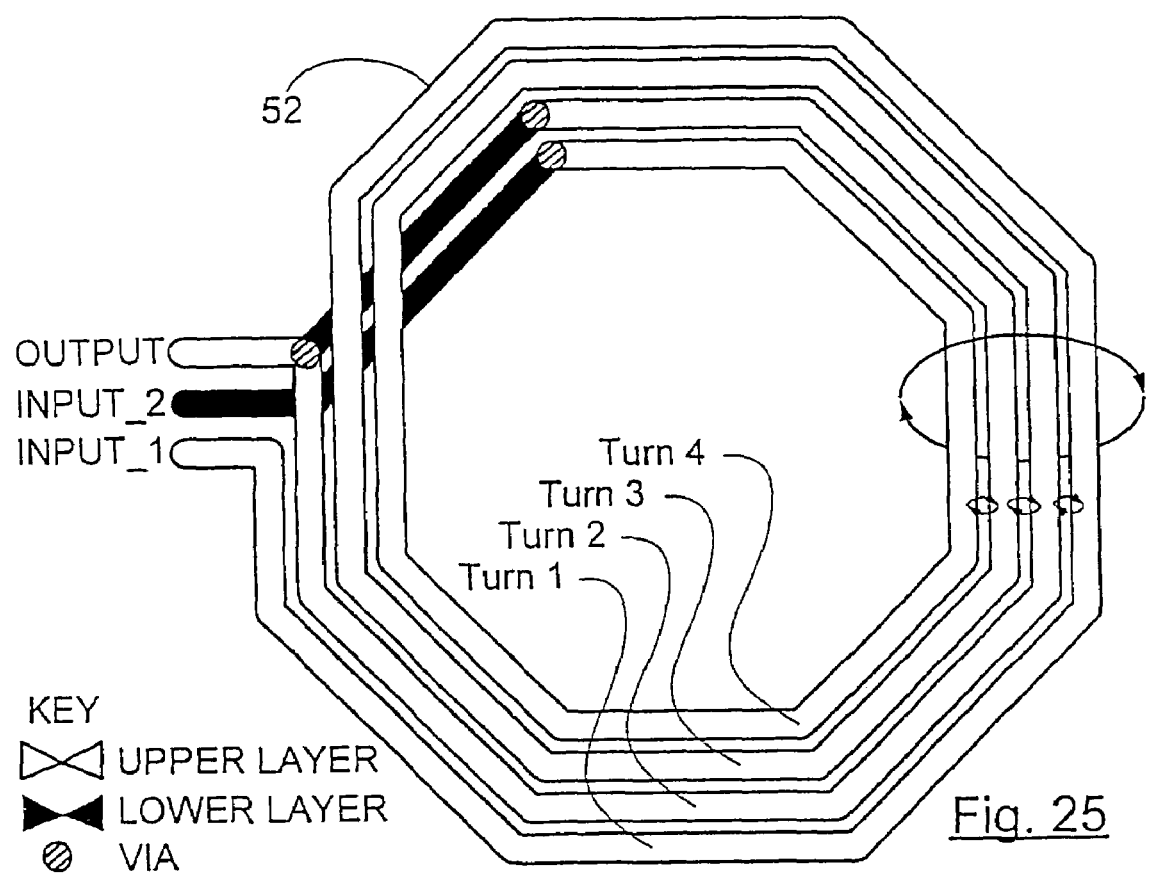
FIG. 25 shows a first layout of an inductor in an integrated circuit suitable for use in embodiments of the invention.

FIG. 25 shows an inductor layout 52 being a possible on-chip physical layout for coupled inductors corresponding to the inductor circuit 24 in FIG. 11 for the case of a 1:1 turns ratio and where the resonance inductance $L_R$ is equivalently provided by a leakage inductance between two coupled inductors $L_{S1}$ and $LS_2$ as described previously in relation to FIG. 11. The layout is essentially formed as sequential first, second, third and fourth concentric octagonal turns, the 1st being the outermost and the fourth being the innermost. The turns could equally be circular but octagonal structures are commonly substituted for circular structures in chip fabrication to simplify requirements on lithography processes. The inductor layout 52 is formed from two layers of metallization, being an upper and lower layer etched or otherwise patterned to form broadly octagonal conductive paths onto an insulating substrate the two metallization layers being insulated from each other except where connected by via. The $1^{st}$ and $3^{rd}$ turns of inductor layout 52 correspond to inductor LS1 in inductor circuit 24 whilst the second and fourth turns correspond to the inductor LS2 in inductor circuit 24. As previously described in relation to FIG. 7, the current flows in the inductor circuit 24 can be viewed as the superposition of two component current flows $I_{SELF}$ and IL. For the $I_{SELF}$ component of current flowing between the two input terminals of the inductor layout 52, the rotational direction of current flow is the same in all four turns and the effective inductance seen between the two input terminals is quite high. The magnetic field in this case is reinforced by all four turns and is of a quite large spatial extent, tending to encompass all four turns. By contrast, IL (the component of current flow due current flowing from the output terminal of inductor layout 52) causes current to flow in opposite directions in each adjacent turn. In this case, the magnetic field is mainly confined to the spaces between the turns leading to a small leakage inductance, which nevertheless can equivalently provide the resonance inductance LR of the inductor circuit 24.

Figure 26:
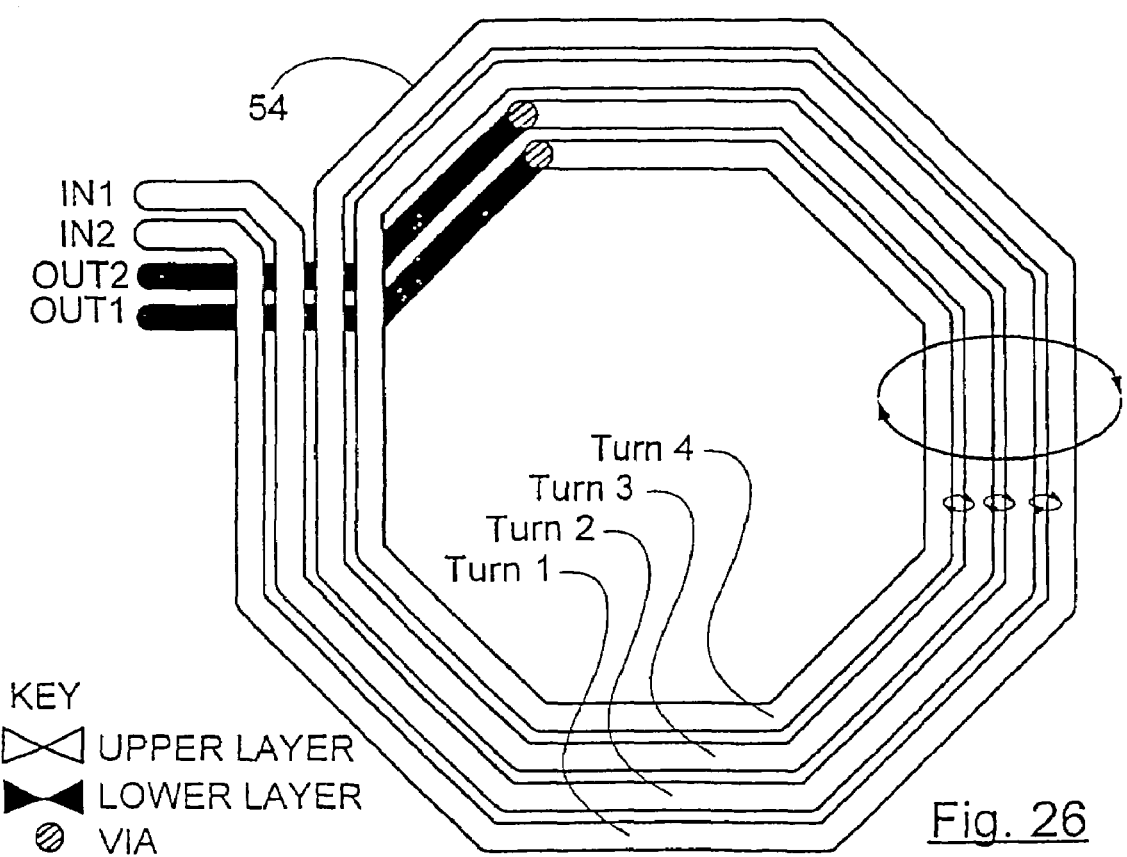
FIG. 26 shows a second layout of an inductor in an integrated circuit suitable for use in embodiments of the invention.

FIG. 26 shows an inductor layout 54, a possible on-chip physical layout for coupled inductors corresponding to inductor circuit 19 in FIGS. 9 and 23 and where the resonance inductances $L_{R1}$ and LR2 are equivalently provided by a leakage inductance between two coupled inductors $L_{S1}$ and $L_{S2}$ as described previously in relation to FIG. 23. The inductor layout 54 is constructed as two metallization layer as described in relation to the inductor layout 52. The layout is again composed of a sequential first, second, third and fourth concentric octagonal turns, the first being the outermost and the fourth being the innermost. In this case, the first and third turns correspond to the coupled inductor LS1 in inductor circuit 19 while the second and fourth turns correspond to the coupled inductor LS2 in the inductor circuit 19. As previously described in relation to FIGS. 9 and 10, the current flows in coupled inductors LS1 and LS2 of inductor circuit 19 can be viewed as the superposition of two signal components of current flows $I_{S1}$, $I_{S2}$ being of opposite polarity superimposed on a common mode component of current flow $I_{CM}$. For the $I_{CM}$ component of current flow, the rotational direction of current flow is the same in all four turns and the effective inductance seen between input terminal IN1 and output terminal OUT1 is quite high. Similarly, the effective inductance seen between input terminal IN2 and output terminal OUT2 is also quite high. The magnetic field in this case is reinforced by all four turns and is of a quite large spatial extent, tending to encompass all four turns. By contrast, $I_{S1}$ and $I_{S2}$, the signal components of current flow cause current to flow in opposite directions in each adjacent turn. In this case, the magnetic field is mainly confined to the spaces between the turns leading to a small leakage inductance, which nevertheless can equivalently provide the resonance inductance LR1 and LR2 of the inductor circuit 19.

Figure 27:
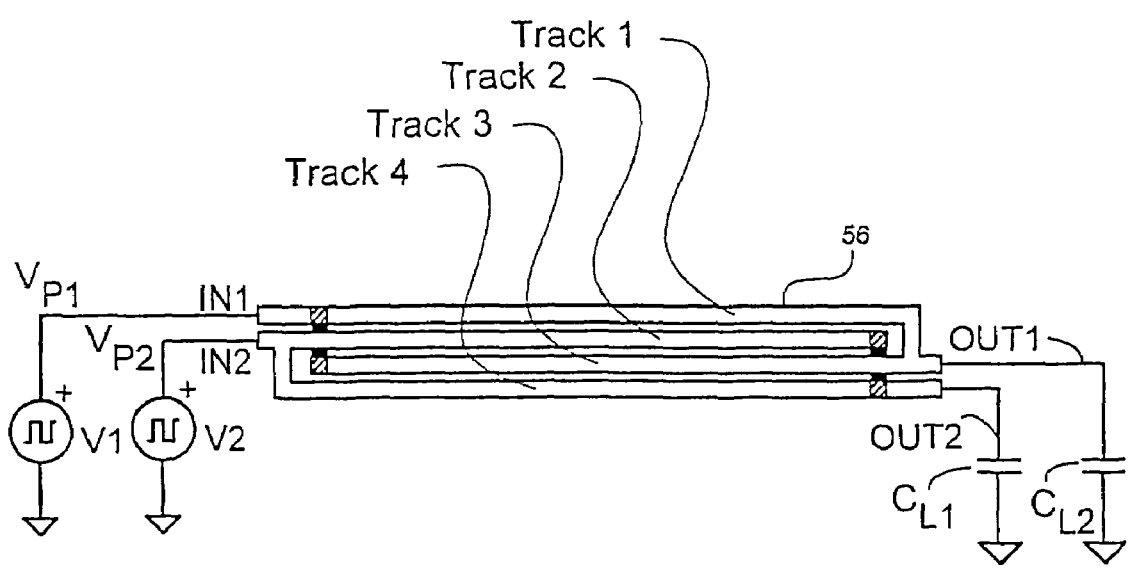
FIG. 27 shows how coupled inductor circuits, and particularly coupled inductor circuit can be laid out in embodiments of the invention.

FIG. 27 shows how coupled inductor circuits, and particularly coupled inductor circuit 19 can be laid out to serve the additional function of circuit interconnect. The circuit in FIG. 27 is equivalent to that of FIG. 9 but coupled the inductor circuit 19 in FIG. 9 has been replaced by the layout 56 shown in FIG. 27. The layout 56 is similar to the layout 54 but has turns 'un-wrapped' into linear inductive tracks. The first and second tracks in the layout 56 correspond to a first "unwrapped" instance of the layout 54, while the third and fourth tracks un the layout 56 correspond to a second unwrapped instance of layout 54. Whilst a single 'unwrapped' instance of layout 54 could be used, placing a second or further multiple instances side-by-side to increase the effective inductance seen by a common mode component of current flow $I_{CM}$, compared to the inductance seen by signal components of current flow $I_{S1}$ and $I_{S2}$. In a practical embodiment of the circuit of FIG. 27, signals $V_{P1}$ and $V_{P2}$ would typically be provided by a switching circuit (or drive circuit). In situations were the physical location of the load capacitance is remote from the switching circuit, the layout 56 fulfils the dual function of an interconnect (between physical locations) and a coupled inductor circuit. The main advantages are a more efficient use of chip area and a reduction in resistive losses, compared with the separate provision of coupled inductor circuit and interconnect functions.

Circuits designed in accordance with this invention typically drive one or more capacitive loads to produce outputs signals, which, in response to one or more input signals, make approximately sinusoidal transitions between a high and a low voltage level. As previously discussed, in the majority of embodiment the relative timing of the input signals, needs to be correct in relation to the sinusoidal transition time of the output signal(s) for efficient operation. For example, in the circuit of FIG. 11 and referring to FIG. 12, the input signal $V_{C2}$ is delayed relative to input signal $V_{C1}$ by time approximately equal to the sinusoidal transition time of the output signal $V_O$. In FIG. 12, the input signal $V_{C1}$ makes a first transition at time t1 and the input signal $V_{C2}$ makes a first transition at time t2. The input signal $V_{C2}$ could be produced in a number of ways. For example, $V_{C2}$ could be controlled in response to the level of output signal $V_O$.

Alternatively, $V_{C2}$ could be derived from $V_{C1}$ via an adjustable delay element which is adjusted in response a characteristic of one or more previous transitions of output signal $V_O$. As a further alternative, since the sinusoidal transition time of output signal $V_O$ is dependent mainly on an LC time constant $V_{C2}$ could be derived from $V_{C1}$ via an LC delay element designed to reproduce the required delay.

The invention claimed is:

1. An electronic driver circuit for driving a capacitive load between supply potentials comprising
   a. first and second respective switching devices to independently switch current either to or from first and second respective voltage supply sources; and
   b. first and second inductors with mutual magnetic coupling that act to store energy derived from the voltage supply sources; wherein
   c. the coupled inductors form an LC resonator with the load such that, in operation, when current is switched from the first supply source to the load in driving a partial change in the voltage of the load, current is also pumped up by the inductors from the second supply source to the load by virtue of the mutual magnetic coupling to drive the change in the voltage of the load.

2. A driver circuit according to claim 1 in which the coupled inductors are electrically coupled in series with one another.

3. A driver circuit according to claim 2 in which the coupled inductors are connected in series across the voltage supply sources, being connected thereto by the switching devices.

4. A driver circuit according to claim 2 having a resonance inductor connected to a common point between the coupled inductors.

5. A driver circuit according to claim 1 in which the coupled inductors are coupled magnetically without a direct electrical interconnection.

6. A driver circuit according to claim 1 in which the coupled inductors connect to or constitute part of the inductance in an LC resonator formed with the load.

7. A driver circuit according to claim 6 in which the coupled inductors form a substantial part of the inductance of the LC resonator.

8. A driver circuit according to claim 1 for driving two loads with complementary signals.

9. A driver circuit according to claim 1 in which one or both of the voltage sources is a voltage supply rail.

10. A driver circuit according to claim 9 in which one or both of the voltage sources includes a reservoir capacitor maintained at a potential at or near the supply rail.

11. A driver circuit according to claim 10 in which one or both of the voltage sources are supplied from the reservoir capacitor(s).

12. A driver circuit according to claim 1 in which one or more of the switching devices is a MOSFET.

13. A driver circuit according to claim 12 in which one or more switching device is a MOSFET inverter.

14. A driver circuit according to claim 1 in which one or more switching device includes diodes through which energy returned to a power supply.

15. A driver circuit according to claim 1 implemented in an integrated circuit for driving a load on or off the integrated circuit.

16. A driver circuit according to claim 1 further comprising an energy recovery inductor connected to couple with the coupled inductors.

17. A driver circuit according to claim 16 in which the energy recovery inductor has a greater number of turns than either of the coupled inductors.

18. A driver circuit according to claim 1 in which the coupled inductors are at least partially constituted by an interconnect.

19. A driver circuit according to claim 1 in which the coupled inductors are at least partially fabricated in an integrated circuit.

20. A driver circuit according to claim 1 further including a clamp circuit to clamp the output voltage of the circuit to a target voltage.

21. A driver circuit according to claim 1 further including one or more DC blocking capacitor to prevent persistent flow of DC current through the coupled inductors.

22. A driver circuit according to claim 1 that is driven by first and second input signals.

23. A driver circuit according to claim 22 in which each of the input signals controls a respective one of the switching devices, each input signal having an active state and an inactive state.

24. A driver circuit according to claim 22 in which the waveform of the second input signal is a time-shifted function of the waveform of the first input signal.

25. A driver circuit according to claim 22 in which the waveform of the second input signal is in the inactive state only within a period in which the first input signal is in the active state.

26. An electronic driver circuit for driving a capacitive load between supply potentials, comprising:
   a. first and second switching devices to independently switch current either to or from first and second respective voltage supply sources; and
   b. first and second coupled inductors with mutual magnetic coupling that act to provide an intermediate voltage for driving the load when at least one of the first and second switching devices is switched; wherein
   c. the coupled inductors form part of an LC resonator with the load such that, in operation, when current is switched from the first supply source to the load in driving a change in the voltage of the load, current is simultaneously pumped by the inductors from the second supply source to the load by virtue of the mutual magnetic coupling.

27. An electronic driver circuit according to claim 26 in which a portion of the resonance inductance is provided by a resonance inductor.

28. An electronic driver circuit according to claim 26 in which a portion of the resonance inductance is provided by the coupled inductors.

29. A method of driving a capacitive load between first and second respective voltage supply sources comprising:
   providing a driver circuit having first and second respective switching devices connected to first and second inductors that have mutual magnetic coupling and form and LC resonator with the load;

applying a first signal transition to the first switching device to switch current from the first supply source to the load to drive a partial change in voltage of the load towards a potential of the first voltage supply source while causing current to be pumped by the inductors from the second supply source to the load by virtue of the mutual magnetic coupling;

applying a second transition to the second switching device to drive a further change in voltage of the load.

30. The method of claim 29, wherein the second transition is arranged to coincide approximately with a completion of the partial change in voltage of the load.

* * * * *